(12) United States Patent
Kernahan

(10) Patent No.: US 10,411,147 B2
(45) Date of Patent: Sep. 10, 2019

(54) IDEALIZED SOLAR PANEL

(71) Applicant: Kent Kernahan, Corvallis, MT (US)

(72) Inventor: Kent Kernahan, Corvallis, MT (US)

( * ) Notice: Subject to any disclaimer, the term of this patent is extended or adjusted under 35 U.S.C. 154(b) by 0 days.

(21) Appl. No.: 14/603,416

(22) Filed: Jan. 23, 2015

(65) Prior Publication Data

US 2015/0136200 A1 May 21, 2015

Related U.S. Application Data

(62) Division of application No. 13/352,330, filed on Jan. 17, 2012, now Pat. No. 8,952,672.

(60) Provisional application No. 61/433,350, filed on Jan. 17, 2011.

(51) Int. Cl.
  *G05F 1/40* (2006.01)
  *H01L 31/042* (2014.01)
  *H01L 31/02* (2006.01)
  *H02J 3/38* (2006.01)

(52) U.S. Cl.
  CPC ...... *H01L 31/042* (2013.01); *H01L 31/02021* (2013.01); *H02J 3/385* (2013.01); *Y02E 10/58* (2013.01)

(58) Field of Classification Search
  CPC ... G05F 1/40; G05F 1/62; G05F 1/577; G05F 1/56; G05F 1/67; H02J 7/35; H02M 3/156; H02M 2001/0045
  USPC ........ 323/234, 266, 268, 275, 282, 285, 906
  See application file for complete search history.

(56) References Cited

U.S. PATENT DOCUMENTS

| | | | | |
|---|---|---|---|---|
| 5,616,185 | A  * | 4/1997 | Kukulka | H01L 31/035281 136/244 |
| 6,809,678 | B2 * | 10/2004 | Vera | H02J 1/102 323/299 |
| 2012/0060895 | A1* | 3/2012 | Rubin | H01L 31/0504 136/246 |
| 2013/0018607 | A1* | 1/2013 | Jin | H02S 50/10 702/60 |
| 2013/0147444 | A1* | 6/2013 | Temkin | H02M 3/33523 323/234 |
| 2013/0268812 | A1* | 10/2013 | Liu | G05B 13/02 714/57 |

* cited by examiner

*Primary Examiner* — Adolf D Berhane
(74) *Attorney, Agent, or Firm* — Michael W. Caldwell

(57) ABSTRACT

A solar panel is constructed by electrically connecting one or more banks of solar cells in series, wherein each cell in each bank is electrically connected in series. In some aspects the cells are a quarter of typical full size cells in the direction of current flow. A panel may comprise banks of differing cell counts. Bypass diodes are not used.

8 Claims, 16 Drawing Sheets

IDEALIZED SOLAR PANEL

RELATED APPLICATIONS

This application is, a divisional application of commonly owned U.S. Nonprovisional patent application Ser. No. 13/352,330, submitted Jan. 17, 2012 (now issued as U.S. Pat. No. 8,952,672), which is a non-provisional application of commonly owned U.S. Provisional Patent Application No. 61/433,350, submitted 17 Jan. 2011 (now expired), both of which are hereby incorporated by reference in entirety.

BACKGROUND

Photovoltaic or "solar panels" are an example of a nonlinear power source. Typically in solar panels, bypass diodes, controlled FETs and other bypass schemes have been used in the prior art to limit the power dissipated by a partially shaded photovoltaic ("PV") solar cell or cells. The worst-case condition is an individual partially-shaded cell blocked whilst all other cells in the PV are fully illuminated. Looking to FIG. 1, representative of a typical PV 100, including bypass diodes 102.1 to 102.3 (referred to hereinafter collectively as "102"), a single solar cell, for example the cell denominated as element 106, may become shaded and therefore reverse biased while still conducting appreciable photo current, driven by the other cells in the same string. This may lead to power dissipation in the shaded cell 106 of as much as twenty times normal forward power dissipation. Due to the possibility of such excess power dissipation and an associated temperature increase of the cell and surrounding glass, the buckskin, laminate, solder joints and other components are made very rugged, leading to increased cost, along with a reduction of reliability. Similarly, small defects common in PV solar cells can conduct large amounts of localized current, causing very high power densities. For example, a single avalanche defect involving a site of just 156 microns on a side within a 156 mm on a side single PV solar cell would increase power density at the defect site to one million times greater than the typical reverse voltage with photo current. Avalanche, dislocation, micro cracks and other cell defects which may be considerably smaller than 156 microns on a side have been known to result in holes burning through a cell and solar panel encapsulating layers and in dripping very hot silicon, metal and organic compounds onto rooftops, plants and other combustible materials. The catastrophic nature of this risk leads solar panel manufacturers to incur considerable test costs and yield losses. Despite the PV industry's best efforts, some of these defects still occur in the field. For example, increased cyclic mechanical stress caused by large daily power dissipation swings of partially shaded cells may lead to micro cracking and/or a reduced avalanche breakdown voltage even though no such defect existed when the PV was manufactured.

In the prior art, methods and apparatus for preventing hot spots from occurring have been suggested. For example Kernahan, in U.S. Pat. No. 8,050,804, discloses a method wherein characterization data is taken from a given solar panel by a flash tester. The characterization data is used during operation and adjusted for temperature to control the solar panel current with the expectation that no solar cell is caused to become reverse biased. However such approaches may fail in that the method, or electronic module by which the method is performed, has no means for determining any change in characteristics after a solar panel has been tested. For example, a given solar cell may later develop microcracks, severely lowering its breakdown voltage and/or making part of the cell inactive, undetected by the disclosed control module. As a result, the module may allow or even cause a cell to become reverse biased, thereby creating a hot spot.

The need for high avalanche voltage leads panel manufacturers to use high quality (known high avalanche break down voltage) cells, keeping material costs high by forbidding the use of cells with lower break down voltages or cells made from less pure materials. What is needed is a way to construct a solar panel without bypass diodes wherein no solar cell, regardless of instant condition, may become reverse biased.

FIG. 2 is an example of an idealized voltage-current (VI) and voltage-power graph for a photovoltaic panel in an arbitrarily defined scenario wherein most cells have 1.0 sun insolation (the current along curve 224) and one or more cells have a 0.6 sun insolation due to shading (the current along curve 226) for one string of a PV configured according to FIG. 1. Being in series electrically, all cells in the string will have identical current, so each cell will develop a voltage according to its individual insolation level. Thus we see a voltage $V_{0.6}$ (232) and $V_{1.0}$ (234) corresponding to the common current 222. The graph of FIG. 2 is deemed idealized because it would be a simple matter for an inverter to hold the PV 100 at its maximum power point in that the power delivered, defined as V*I, is constant at a given temperature, as indicated by $P_{1.0}$ (228) and $P_{0.6}$ (230). As temperature increases, the power and current curves would move down.

FIG. 3 is an example of current and power characteristics of a typical PV 100. The family of power curves 324, 326 correspond to the VI curves for 1.0 sun 324 and 0.6 sun 326 insolation. A power solution corresponding to current I1 (330) is not possible, in that the cell with 0.6 sun insolation cannot provide enough current 342. The solution I2 (322) is be possible in that the current for 0.6 sun 342 and for 1.0 sun 340 can a common current value of 12 (322). However at current I2 (322) the series-connected cells providing voltage $V_{1.0}$ in series with a single cell at $V_{0.6}$ may cause the cell receiving less radiance to be reverse biased. In that condition the other cells (at $V_{1.0}$) may have enough power to damage, even causing catastrophic failure of, the cell at $V_{0.6}$; that is, the cell may be over powered by the other cells such that it cannot provide the voltage $V_{0.6}$. Therefore a problem with the control of conventional solar panels is the possibility of a spread between the insolation, hence voltage, levels of fully exposed cells and one or more cells that are shaded.

Inverters and other panel controllers are used for operating a panel at its maximum power point condition. Many of these use a method denominated "perturb and observe" (PAO), wherein the controller modifies the load condition, for example to draw more current, then determines the power output of the panel. If the power has increased, the controller keeps changing the conditions in the same direction until the power diminishes, at which point it returns to a previous condition, deemed to be a new maximum power point condition. If the first experiment caused the power to go down, then the experiment is repeated in the opposite direction.

In a partial shading situation, it is possible for the perturb and observe method to create a condition beyond which the bypass diodes are effective, thereby damaging the solar panel. Even without damage, panels constructed using bypass diodes sacrifice some amount of electrical power generation efficiency, as well as areal efficiency, simply by the presence of the bypass diodes.

Solar panel 100 of FIG. 1 and solar panel 400 of FIG. 4 may be installed in any orientation. For simplicity and clarity of discussion the orientations shown will be referred to as the "up" or "upper portion" at the top of the page with the text is viewed right side up.

Partial shading of a PV 100 may result from a variety of causes, such as bird droppings and leaves to name a few. PVs 100 are obviously exposed to the elements, including dust and condensation. Condensation and rain will cause dirt accumulated on a panel to flow to the lower portion of the panel, obscuring the lower cells 108.

SUMMARY

The apparatus and control methods disclosed herein may be effective for the control of one or more serially-connected nonlinear power sources. Examples of such sources include solar panels, wind turbines, batteries, and the like. The control of solar panels is disclosed as but one example of control of such sources. A novel construction structure is also disclosed. As disclosed herein, one aspect of the disclosure prevents damage to or destruction of cells of a solar panel resulting from a lack of uniformity of power provided from cell to cell, for example due to partial shading of the panel or an individual cell. The example embodiment disclosed herein assumes that it is controlling a photovoltaic panel, providing its output to an inverter, array converter, or other external electronic controller. As described previously, the external controller may search for a maximum power point by experimenting with the load condition, which may cause damage in the prior art, especially under partial shading conditions. Thus another aspect of the disclosure is to protect a photovoltaic panel when a controller makes such an experiment. Indeed the external controller may not be aware of the present invention, but simply respond to the conditions it senses when making changes. Several advantages result, for example enabling the construction of solar panels using cells having a lower than ideal breakdown voltage. Such cells are presently treated, and priced, as manufacturing fallout and are only used in lower-end products, such as rechargeable home landscape lighting. Using such cells in a commercial quality solar panel may lower the materials cost. According to the disclosure, construction and electrical interconnect of the cells is such that protection diodes are not needed, thereby saving their cost as well as improving efficiency. In another aspect, less current is drawn from a solar panel 400 for a given power output level, thereby allowing the use of smaller and fewer power-carrying lines, which also lowers material cost and provides for more area exposed to the available light for a given panel size than solar panels 100 constructed according to the prior art.

Safety may be enhanced by preventing localized hot spots which, if not protected against, may lead to not only destruction of a solar panel but to the facility on which the panel has been installed.

As disclosed herein, the output voltage of a panel may be increased by using cells that are smaller (shorter in the direction of current flow) than standard size cells, for example one quarter cells. Total cell area in a panel is made the same by using more of the smaller cells, for example four times more of one-quarter sized cells. The result is a string of cells in a panel which provides higher voltage at lower current for a given power level. An electronic apparatus, for example a buck switching power converter, may be operatively connected to the cells of the PV 400, the converter preconfigured to provide an output characteristic of VI close to the ideal characteristic of FIG. 2. Due to the control provided by the electronic apparatus, it is not possible for a given cell to be reverse biased, therefore no bypass diodes are needed, saving cost and improving efficiency and safety.

In some aspects of the disclosure the cells at the physically lower end of a PV 400 are connected as a bank in series with another bank comprising the remaining cells, enabling each bank to be separately controlled, for example by a buck or boost-type switching power converter. PVs are obviously exposed to the elements, including dust and condensation. Controlling the lower portion cells, which may be more obscured by shadows, dust and other dirt than the upper portion, allows the upper portion to be operated at a higher power point, thereby improving the total power output, hence efficiency, of a given panel.

In one aspect the disclosed inventive concept does not attempt to control a photovoltaic panel to its maximum power point. An example of this aspect is disclosed wherein the actual controlling of a panel to attain its maximum power point is assumed to be done by an external control system, for example an inverter, a micro inverter, or an array converter. In other aspects the disclosed apparatus also controls a solar panel to approximately it maximum power point condition. Both conditions are disclosed herein.

BRIEF DESCRIPTION OF THE DRAWINGS

The accompanying drawings, which are incorporated herein and constitute part of this specification, illustrate exemplary aspects of the inventive concept, and, together with the general description given above and the detailed description given below, serve to explain features of the inventive concept.

DETAILED DESCRIPTION

Definition of Some Terms:

| Term | Definition |
| --- | --- |
| Insolation | Irradiance due to solar radiation. Expressed in watts/meter$^2$. |
| One Sun | Industry standard of irradiance, defined as 1,000 watts/meter$^2$. |
| VminM1 | Guardbanded minimum PV voltage parameter. |
| NOCT | Normal Operating Cell Temperature: the expected temperature of a PV during operation at specified conditions. |
| STC | Standard Test Conditions: the condition of a PV during manufacturing test. |
| Tp | Time duration of power FET ON signal in a switching power converter. Tp is a portion of T, the period of the switching frequency. |
| PV | Photovoltaic panel, often called a "solar panel", comprised of electrically connected individual photovoltaic cells. |
| MHO | One MHO is equal to the reciprocal of one ohm, and is sometimes referred to as one "siemens." |
| Duty cycle | For a switching power converter, Tp/T or, ON time over frame time. |

Various embodiments according to the concepts of the disclosure will be described in detail with reference to the accompanying drawings. Wherever possible, the same reference numbers will be used throughout the drawings to refer to the same or like parts. References made to particular examples and implementations are for illustrative purposes, and are not intended to limit the scope of the inventive concept or the claims.

Figure 4:
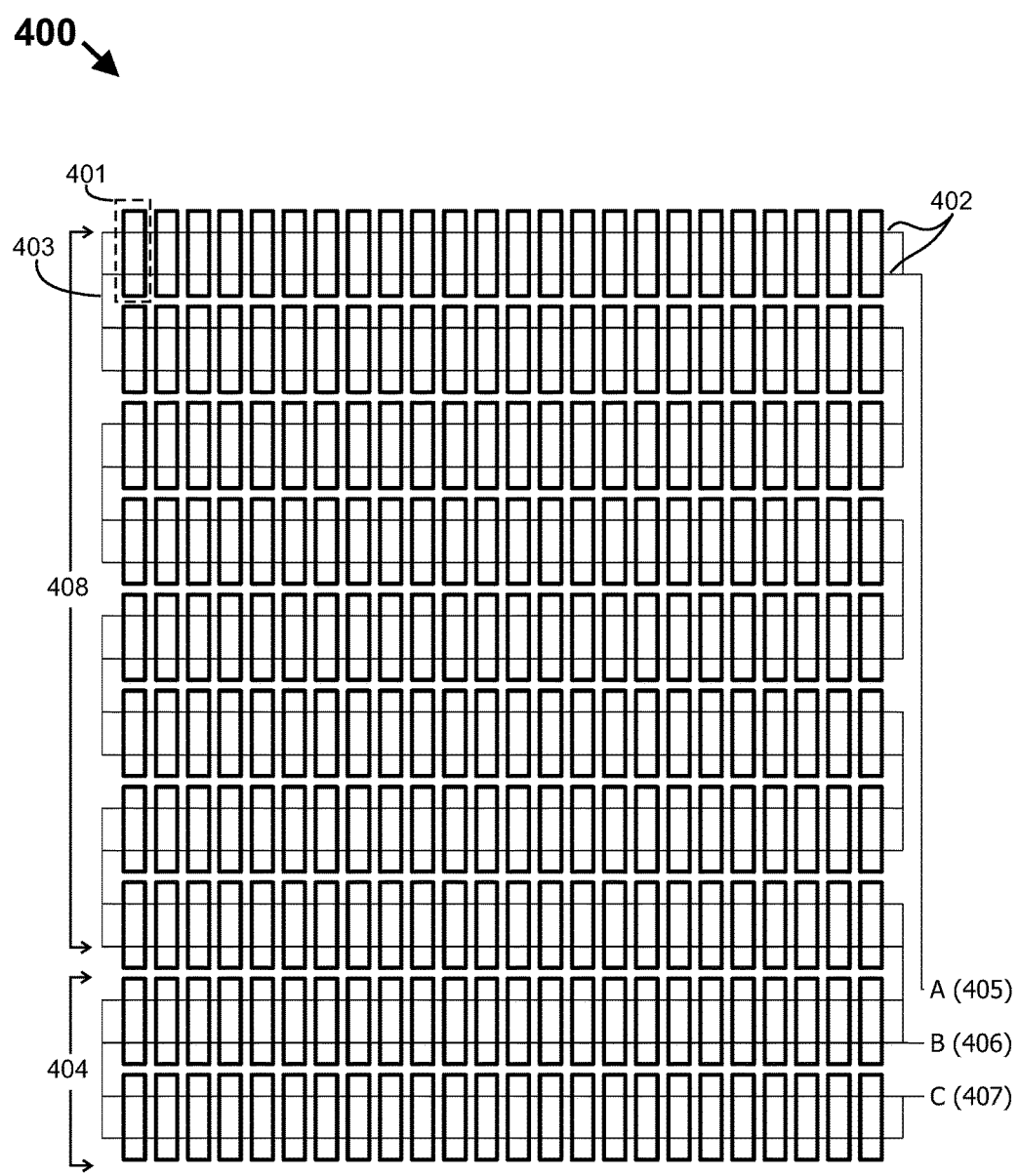
FIG. 4 is an example of a schematic of an exemplary solar panel.

As disclosed herein, each solar cell, such as the exemplary single cell 401 of FIG. 4, is a fraction of a standard cell. That is, each cell may be a fraction of the length of a standard cell as measured in the direction of current flow. In this disclosure one quarter of a standard cell length will be used as an example of a fractional cell, though other fractions may be used. In the quarter cell format, currents are reduced to one fourth what they would be in a full cell form factor. For example, a full cell 106 is shown on FIG. 1. The full cell in this case may have a photocurrent of approximately 8 A at one sun. A quarter cell of the same material and processing would produce approximately 2 A at one sun. Utilizing quarter or other cell fractions allows the use in construction of a PV 400 of portions of full cells that have large cracks, broken sections, anti-reflective coating defects, contact defects and other fabrication or handling defects that would otherwise cause the entire cell to be scrapped or sold for lesser value. In such circumstances, according to some embodiments of the present inventive concept, the defective portion may be discarded, allowing the smaller, undamaged portion to be used. As will be disclosed hereinafter, total PV 400 cost may be reduced by being able to use cells having a lower avalanche break down voltage than is presently usable.

Figure 1:
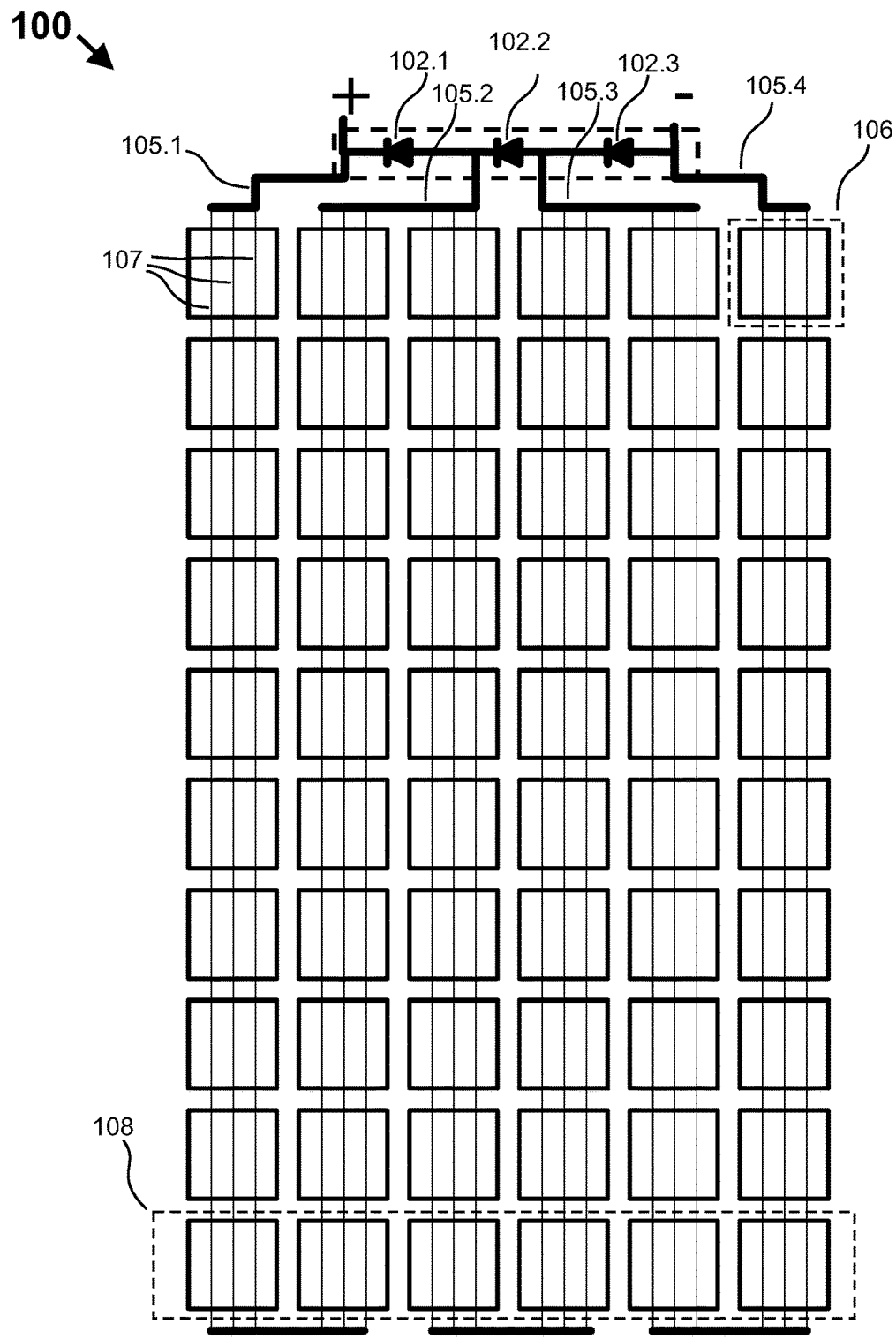
FIG. 1 is a schematic of a typical solar panel. PRIOR ART.
Figure 2:
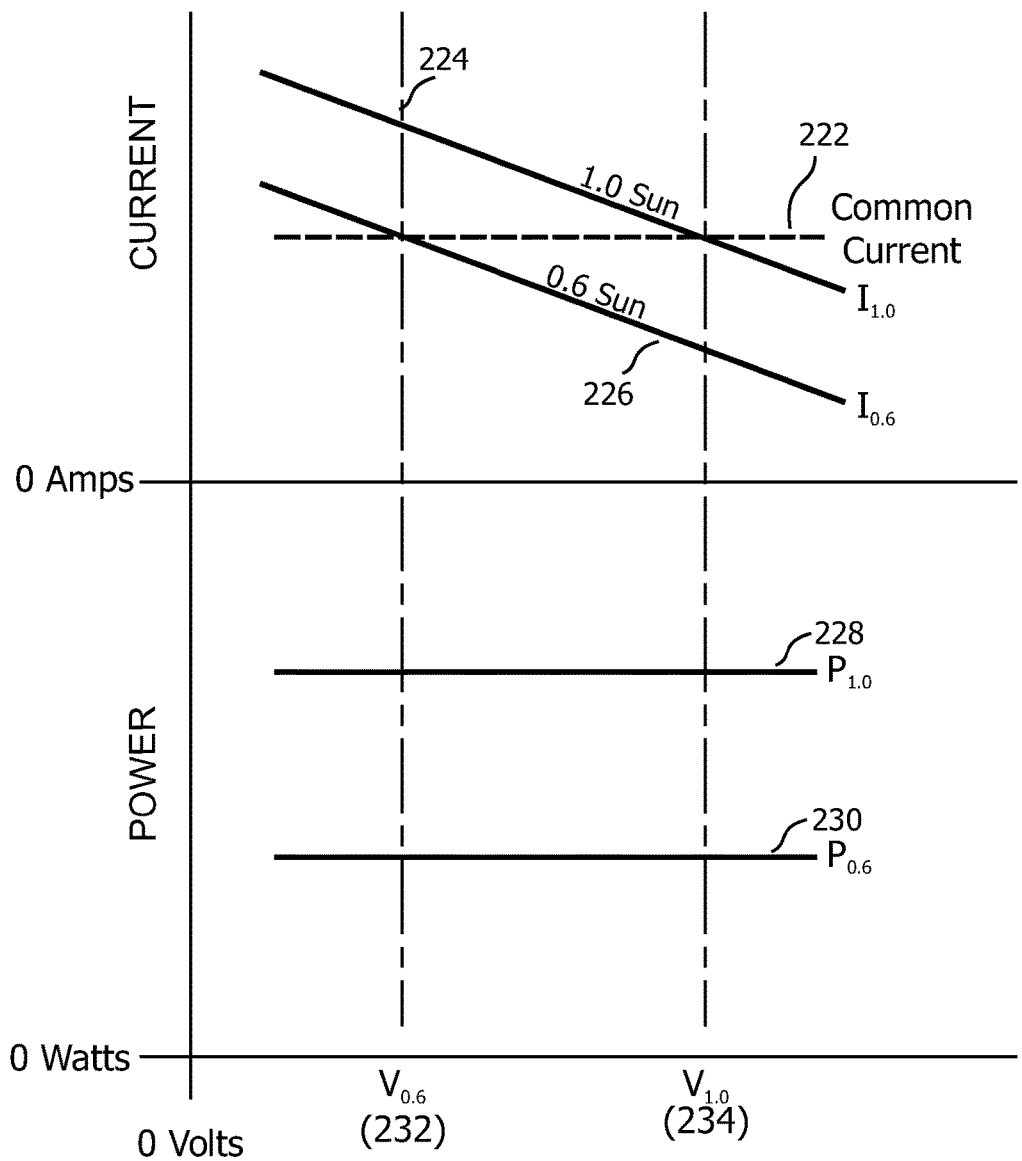
FIG. 2 is a graph of the output family of curves at varying insolation levels of a theoretically ideal PV.
Figure 3:
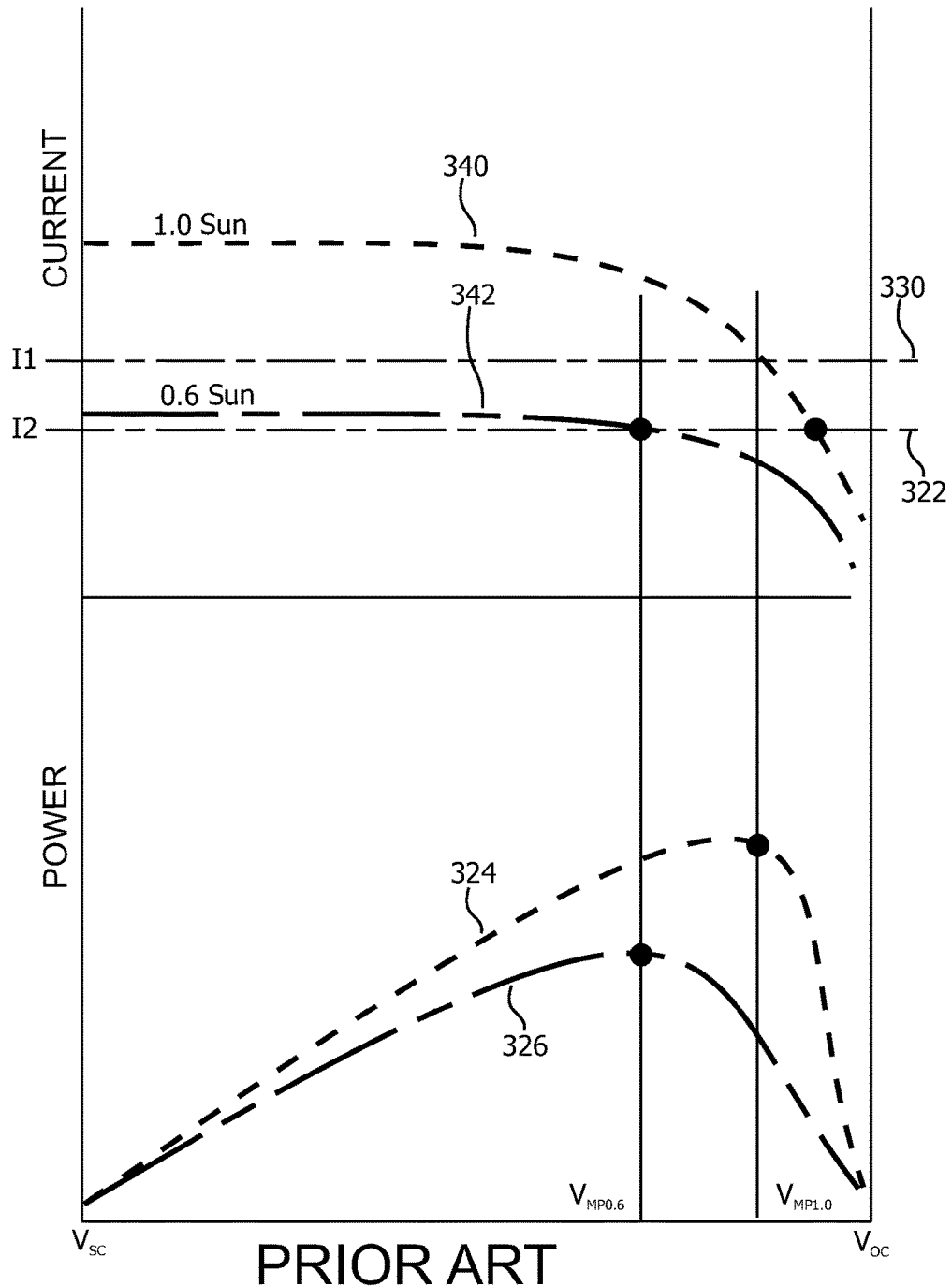
FIG. 3 is a graph of the output family of curves at varying insolation levels of a typical conventional PV.

In a typical solar panel, as in FIG. 1, three bus traces 107 are used per string due to the relatively high current being conducted by the traces 107. According to the disclosed concept, due to the lower current operation, fewer, for example two traces 402, may be used to connect the cells in series, as shown in FIG. 4. Also due to lower current, each trace of a panel 400 may be less wide than for a conventional panel 100 using full-size cells, further improving areal efficiency. Similarly, the quarter cell format, with its reduced current, may require significantly smaller joining bars as exemplified by joining bar 403 compared to those of a standard panel 105.1 to 105.4 (collectively referred to hereinafter as "105.n"), further reducing cost. The quarter cell format panel 400 uses approximately the same amount of silicon (cell area) as the full cell panel 100. In the example discussed herein, for the same size panel, the solar panel shown in FIG. 4 may be constructed with 240 cells compared to the 60 cells of FIG. 1. In some aspects of the disclosure, the formation of hot spots is prevented by limiting reverse bias on individual cells, using no intermediate bus bars (such as 105) routed to a junction box for bypass diodes. Prior art bypass diodes and similar schemes are used to limit how high a temperature will be reached within the cells when substantial reverse bias is impressed on an individual cell. As can be seen by examining FIG. 1, one diode may be required for approximately every twenty cells in order to provide a means of minimizing the reverse voltage that may be applied to any individual cell.

In the example of FIG. 1, if each cell had a voltage when illuminated of about 0.5 V then the arrangement shown would nominally prevent reverse voltages from exceeding about −10 V. In reality, the circuit in FIG. 1 can allow large amounts of power to be dissipated within an individual cell. This may be so because the decision to reduce the voltage imposed across the solar panel may be made by an external inverter (not shown). The decision by the inverter may be made with substantial forward photocurrent still available from each individual cell. For example, consider a forward photocurrent of approximately 8 amps when an attached solar inverter made a decision to reduce the voltage across the panel for the purpose of maximizing the power across an array of series connected solar panels. A shaded individual cell may have full or nearly full photocurrent driven through it with an imposed voltage of −10 V or more, resulting in a power dissipation of approximately 80 W.

In the prior art, the effects of hot spots due to partial shading are diminished by the use of bypass diodes. A bypass diode (102.1, 102.2, 102.3 of FIG. 1, collectively "102.n") is connected in parallel with a string of solar cells, but with opposite polarity. When all cells of a string are uniformly illuminated, each cell is forward biased and therefore its corresponding bypass diode (102.n) is reverse biased, therefore effectively an open circuit. However if one or more cells in a string is partially shaded to the extent that it becomes reverse biased, the bypass diode 102.n conducts, allowing the current from the unshaded cells to flow through the external circuit. The maximum reverse bias across the shaded cell is approximately the sum of the diode drops of all of the other cells in the series-connected string. That is, all the power of the fully illuminated cells is provided to the partially shaded cells by the bypass diode, thereby dissipating their power in the partially shaded cell. The number of bypass diodes that are needed to protect a given (conventional) PV 100 is determined by the number of cells in the PV 100. The maximum number of cells in a given string is limited by the sum of all of the open circuit voltages of all of the cells when full illuminated, plus the forward diode drop of the bypass diode, which must be less than the reverse bias breakdown voltage specification for any cell in the string.

For example, using values and components of a typical conventional PV 100, for cells of approximately 0.54 volts Voc, a bypass diode with 1.2 volt forward bias drop, and cells with a breakdown voltage of 12 volts, we can find the number of cells allowed in a given string by:

$n*(0.54)+1.2<=12$, or $n=10.8/0.54$, or twenty cells in series maximum.

Note that the lower the breakdown voltage of the cells the fewer cells may be protected by a bypass diode.

Different PV 100 makers will have slightly different breakdown voltage specifications. It is common in the industry for eighteen to twenty cells maximum per bypass diode. Some cell technologies have such a low breakdown voltage specification that each cell requires a bypass diode. Bypass diodes are expensive, but are used because of the need for safety. As will be disclosed in greater detail hereinafter, a PV 400 constructed according to the present disclosure and controlled by the disclosed apparatus according to its method, will not permit a partially shaded cell to become reverse biased, regardless of the instant breakdown voltage of any cell, thereby eliminating the need for bypass diodes altogether. When a solar cell is not reverse biased, breakdown voltage does not matter. As a result, the PV 400 may be constructed using solar cells 401 with breakdown voltages below the requirements of makers of conventional PVs 100. Because such cells are considered to be scrap cells, a PV 400 may be constructed using such cells at a lower cost. Note, however, that even a perfect solar cell with high (12 volt, for example) breakdown voltage may develop microcracks from temperature cycling and exposure to the elements during its expected twenty-five years product lifetime, thereby lowering its breakdown voltage, therefor the methods according to the present disclosure are also beneficial for use with prime cells.

A safety limitation imposed on the PV industry is a maximum system voltage. In some jurisdictions, system voltage is limited to a maximum of 600V at any given node. For a prior art solar panel, such as shown in FIG. 1, the 25° C. open circuit voltage at one sun may be approximately 42.6V with a temperature to voltage coefficient of −120 mV per degree C. If the climate where such a solar panel is installed might reach −20° C., the open circuit voltage would increase by 5.4V to 48.0 V, resulting in a maximum number of solar panels of twelve in electrical series, to avoid exceeding the allowed 600V system voltage. In a system controlled per principles of the disclosure, the open circuit voltage is controlled to a programmable level such that it does not appreciably change with temperature, thereby allowing up to fourteen solar panels, each programmed for a constant 40V open circuit to be used in series for an increase in power per string of over sixteen percent, reducing wiring and combiner box costs. The maximum voltage may be programmed to a limit whereby the open circuit voltage is further reduced, providing additional cost improvement by allowing even more panels to be connected in series. According to an aspect of the inventive concept, current may be controlled to decrease at a relatively constant voltage for decreasing power and to increase for increasing power due to higher or lower temperatures respectively. Because the current falls with increasing temperature in the inventive concept and the resistance of copper wire increases with temperature, power dissipated in external wire at high temperatures is reduced. The inventive concept also limits the maximum short circuit current to a programmed level which does not depend on illumination levels. The voltage at which the current falls to zero changes little with changes in temperature. As a result, more solar panels may be safely connected in series because the maximum system voltage, which occurs when zero current is drawn from a string of series connected systems, increases little with decreasing temperature. In contrast, the voltage at zero current across conventional solar panels increases in direct proportion to decreasing temperature. Prior art, conventional solar panels maintain their current independent of increasing temperature which increases the power dissipated in external wire at high temperatures. The short circuit current of prior art conventional solar panels is directly dependent on illumination levels requiring thicker wire and other expensive precautions to prevent damage due to atmospheric events such as cloud lensing.

In FIG. 4, the example shows the panel 400 constructed such that the panel 400 would be installed with the top of the page corresponding to the "up" direction. The cells (401, collectively) are oriented with their major axis also pointing up. Other orientations may be practiced; the one shown will be described as an example.

As shown in the example of FIG. 4, the bottom two rows 404 form one string, electrically connected across electrical output terminals B 406 and C 407. In the morning hours, natural condensation from the atmosphere occurs on the surface of a solar panel. Water droplets that form on the surface glass of the solar panel 400 collect dust from the previous day and once the droplets become large enough they transport this dust from the top towards the bottom of the solar panel. As the day progresses normal radiant heat from the sun causes the water to evaporate, leaving behind the dust concentrated towards the bottom of the solar panel 400. This layer of concentrated dust at the bottom of a solar panel differentially affects the cells on the bottom of the solar panel. In the case of the cells oriented with their long axis in the same direction as the longer dimension of the solar panel, from top to bottom, the layer of dust that becomes deposited at the bottom of the solar panel first obscures only part of the bottom row of cells 404. Over time, the dust and dirt at the bottom of the solar panel will accumulate causing appreciable light attenuation to the lower rows of cells 404 and sometimes more. The 80%/20% distribution of solar cells in this solar panel 400 are selected such that the light attenuation due to dirt affects the twenty percent portion 404 of the solar panel 400 without having a major effect on the upper eighty percent 408 of the solar panel 400. This arrangement provides for separate treatment and control of each portion of the panel 400 at risk for being obscured. Of course a different ratio may be used.

In prior art solar panels, the solar panels 100 connected in series with other panels must be relatively closely matched for maximum power point current and their VI characteristic so that the current through each solar panel will be near its maximum power point when the entire string is near its maximum power point. By means discussed in detail hereinafter, embodiments of the present inventive concept reduce the need for each panel 400 to match other series-connected solar panels 400 by maintaining a relatively constant power as the output voltage falls by increasing the output current in approximate proportion. This response is illustrated by the current line 1002 versus voltage of FIG. 10. This behavior is an advantage because when a plurality of controllers 500 (FIG. 5) are electrically connected with their O+ 512 and O− 513 electrical output terminals connected in series, and an entire series of controllers 500 connected to a conventional inverter (not shown), the current through the string controllers 500 must match. Increasing current with reduced voltage allows for systems that are producing lower power to match current with solar panels that are producing higher power by controlling them to provide a lower voltage at a higher current.

Returning to FIG. 10, we see that a somewhat weakened prior art solar panel 100 would have a maximum current determined by its illumination level, dirt, or cell capability and therefore would restrict the maximum current available to other solar panels in the same string of series solar panels to its reduced current level, thereby reducing the output power of all solar panels in the string, not just the solar panel which had weak performance. If we examine what happens above the threshold voltage Vt, in this example an arbitrarily selected 30 VDC, we see that the response of some embodiments of the present inventive concept may be very similar to a conventional solar panel until the current reaches zero. This provides a means for an external inverter to throttle down power levels in a conventional way, without knowledge of the presence of the present invention.

Figure 5:
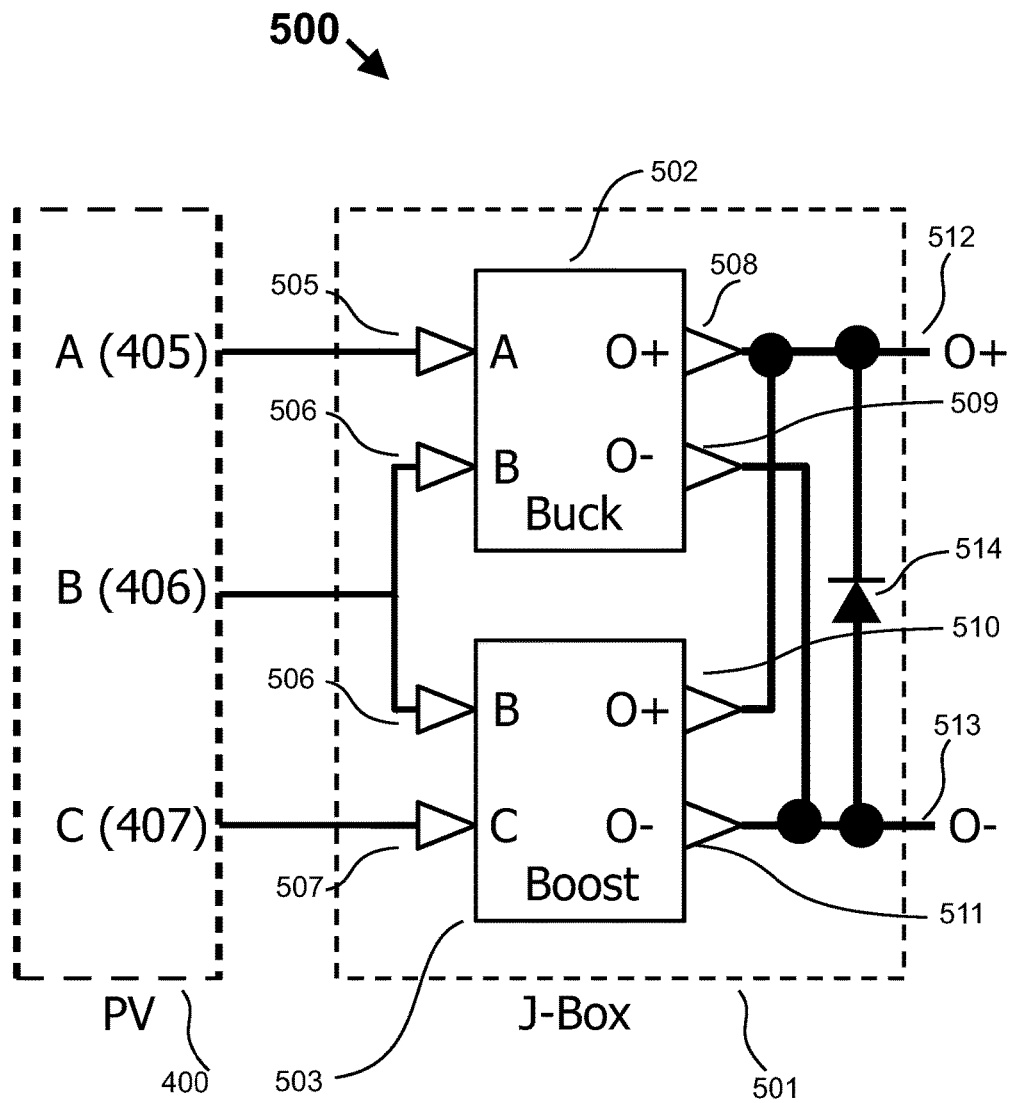
FIG. 5 is a block diagram of an exemplary control system for a photovoltaic panel.

In one aspect, a quarter cell, such as cell 401 of FIG. 4, has a photocurrent of approximately 2 A which ensures that no individual cell will be forced into a large reverse current conduction mode. The maximum power dissipated by any individual cell at one sun is its forward Maximum Power Point (MPPT) voltage of approximately 0.5 V times its forward MPPT current of approximately 2 A or approximately one watt, the power dissipated in normal power production. When partially shaded, power dissipation may be reduced to very low levels within the cells and eliminate reverse conduction. The individual cells are operated at a very low thermal stress, as are front glass, back skin, solder joints and other components associated with the solar panel. Continuing on FIG. 4, we see that the 240 cells are subdivided into two banks. The larger bank on the top represents 80% of the cells, or in this example 192 cells, with the bank on the bottom having 48 cells. This particular 80-20 distribution is one example of a two-bank configuration. Other subdivisions including more than two banks or a different partitioning ratio may be used, for example a 60-40 subdivision or a 60-20-20 subdivision or any subdivision. The array of solar cells has outputs on terminals A 405 and B 406 and C 407. In the fabrication process of the solar panel 400 the terminals A 405, B 406, and C 407 physically emerge through the back skin of the solar panel 400 to be connected to an attached junction box 501 (FIG. 5). The junction box 501 houses the electronics of the controller 500. The PV 400 terminals (A 405, B 406, C 407) are connected to corresponding terminals A 505, B 506, and C 507 within the junction box 501.

Within the junction box 501 may be one or more DC-to-DC power converter systems. In FIG. 5, two power converter systems are shown for illustrative purposes. Power converter system 502 may include a buck power converter 626. The inputs to converter system 502 are shown as electrical input terminals A 505 and B 506. Another DC-to-DC converter system 503 shown within the junction box 501 may include a boost converter 707. The boost converter system 503 has two electrical inputs labeled B 506 and C 507. Although FIG. 5 shows a single junction box with two power converter systems, one a buck and one a boost, it is possible to have more than one junction box and one or more power converters within each junction box. It is not necessary for both power converters to be of identical types nor is it necessary for the power converters to be of different types.

The number and types of power converters is determined by how many cell banks are used and the potential voltage to be provided by each. Still referring to FIG. 5, the buck converter system 502 provides electrical power at output terminals 508 and 509. The boost converter system 503 provides two electrical power output terminals 510 and 511. The positive electrical outputs (508, 510) of the buck converter system 502 and the boost converter system 503 are connected in parallel. The negative electrical outputs (509, 511) of the buck converter 502 and the boost converter 503 are also connected in parallel. One skilled in the art will understand alternative configurations. For example, the system in FIG. 5 may have more than one power converter connected in parallel, a plurality of power converters connected in series, more than one power converter with some outputs in parallel and some outputs in series, or only one power converter with one set of outputs. The electrical output terminals O+ 512 and O– 513 have a parallel-connected diode 514. The diode 514 is connected with its anode connected to the most negative electrical output terminal 513 and its cathode connected to the most positive electrical output terminal 512. The purpose of the diode 514 is to prevent excessive negative voltage in case the system is unpowered but other interconnected solar panels, which may be connected in series, are powered. Standard ten gauge solar wire terminated with industry-standard type MC-4 connectors may be connected to output terminals O+ 512 and O– 513. Different types of wire and different connectors or screw terminals or solder connections may also be utilized.

Figure 6:
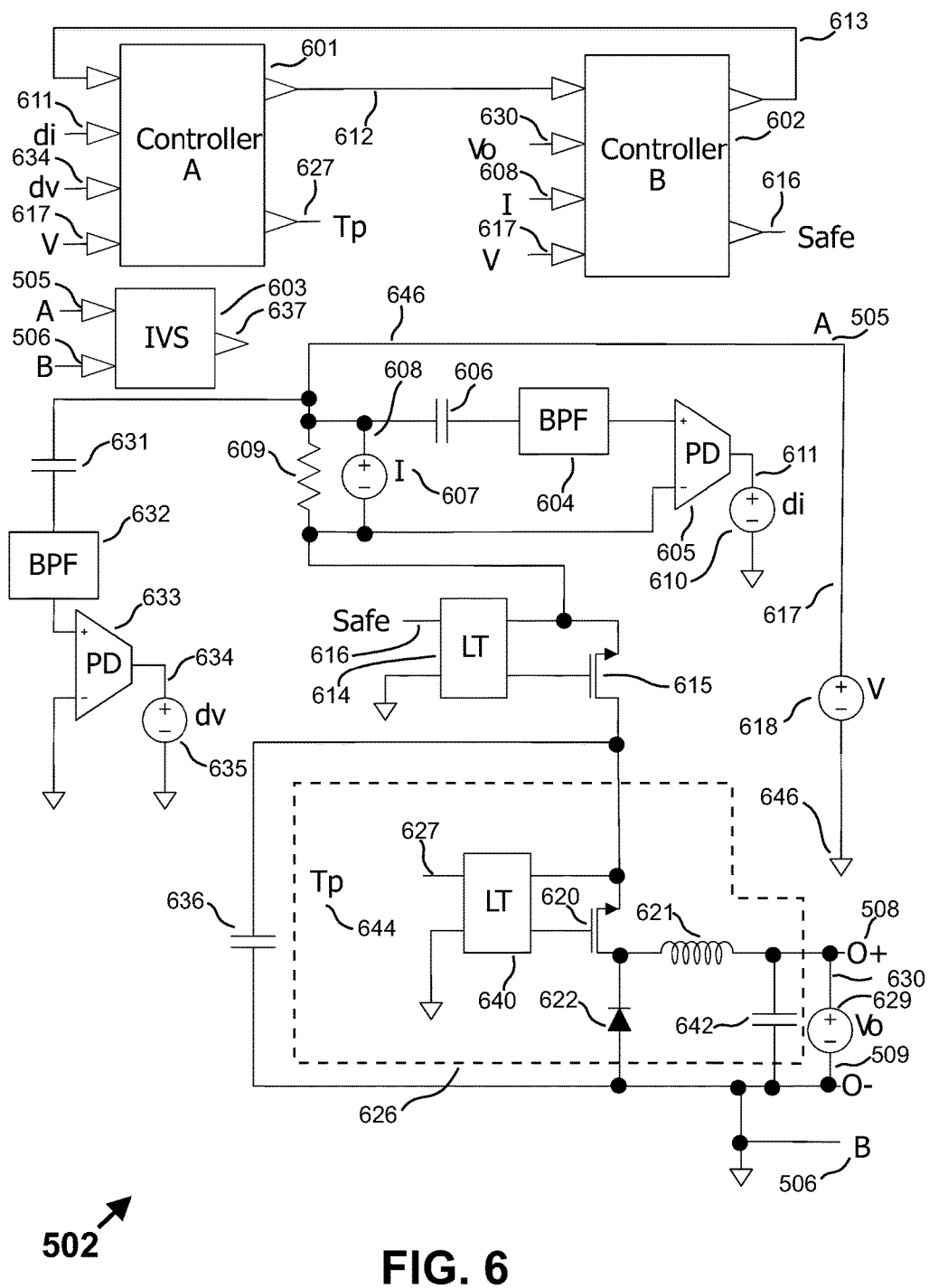
FIG. 6 is a schematic of an exemplary buck converter embodied in a controller.

FIG. 6 presents one embodiment of an example of a buck converter system which may be used for converter 502 of FIG. 5. The buck converter system 502 receives PV output A 405 at electrical input terminal 505 and PV output B 406 at electrical input terminal 506. Buck converter 502 may include a controller providing monitoring, safe operation, and control. In the various embodiments a single controller provides such functions. In the example embodiment of FIG. 6, two controllers, controller A 601 and controller B 602 are disclosed. More than two controllers may be used for additional redundancy, and/or for differing partitioning of functional assignments. For the purpose of illustration, two controllers will be described.

Controllers A 601 and B 602 exchange information on communication lines 612 and 613. Communications lines 612 and 613 allow controller A 601 and controller B 602 to coordinate execution of a control program, for example the process 800 presented hereinafter in FIG. 8. Lines 612 and 613 provide for consistency checks between controller A 601 and controller B 602 such that controller A 601 may note a defect in controller B 602 either by the absence of communication or controller B 602 making a different decision based on the data available to controller A 601. Similarly, controller B 602 may rely upon information received on line 612 to determine whether controller A 601 may be malfunctioning, for example by the absence of communication on line 612, and to also do consistency checks on controller A's (601) calculations based on information available to controller B 602. Embodiments including two controllers provide for additional safety, in that both controllers may be programmed to verify that they agree in decisions and parameters, thus safety is enhanced. However reliability may decrease since the odds of a failure are greater for two devices than for one.

In some embodiments a third controller, similar to controller A 601 and controller B 602 is employed. All three controllers are provided communications between themselves, to provide majority logic, wherein two controllers that agree may disable a third controller that does not agree. This provides continued operation when problems are detected. Per principles of the disclosure the controller 500 includes means to signal attached electronics, for example an inverter, status information to include that there is a problem with the system. Such signals may be imposed upon the output signals of terminals O+ 512 and O− 513. IN other embodiments dedicated signal lines are electrically connected between the converters 502 and 503 and any attached electronics.

Figure 7:
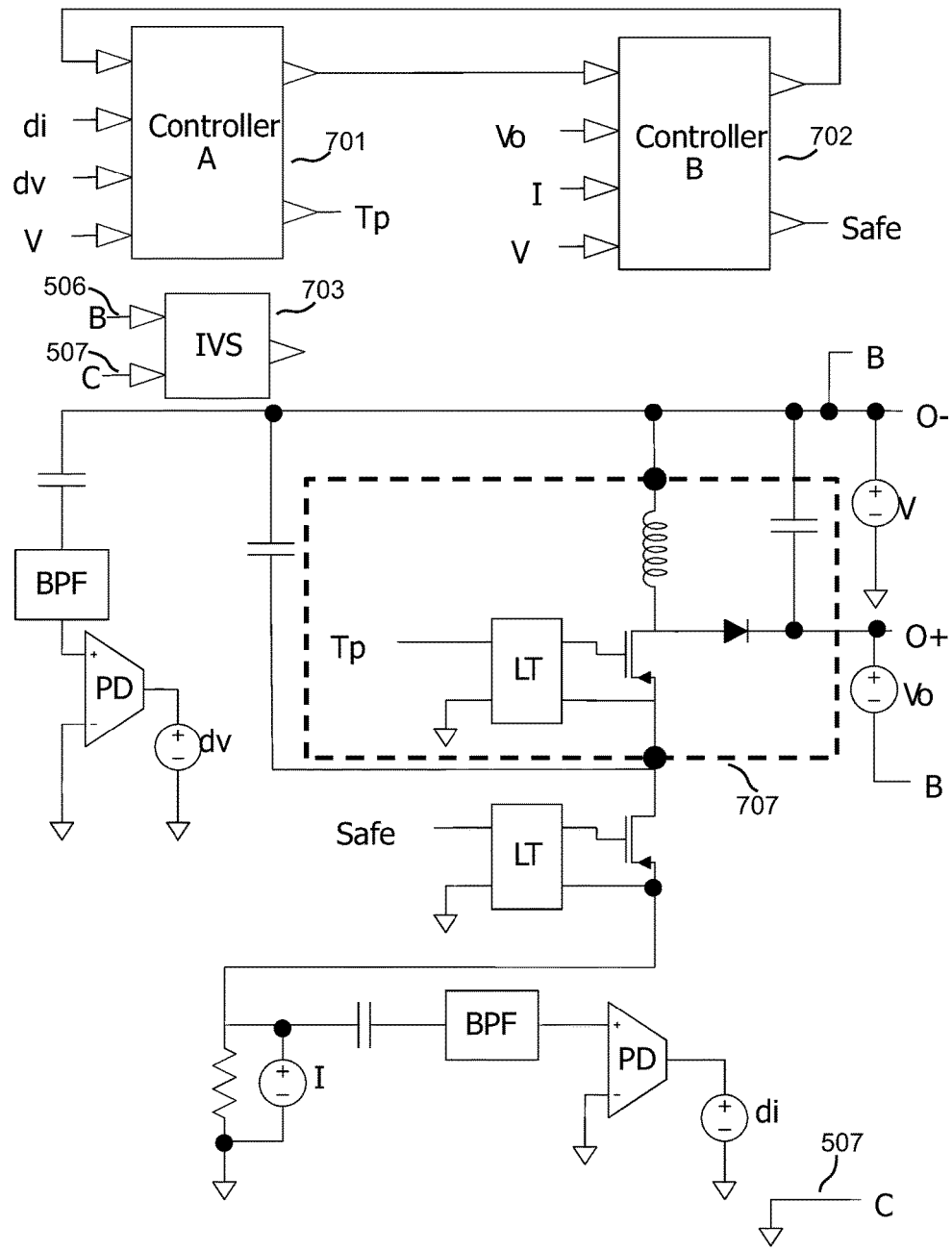
FIG. 7 is a schematic of an exemplary boost converter embodied in a controller.

Per FIG. 6 and FIG. 7, system 502 has two controllers 601,602 and system 503 has its own two controllers 701, 702. Noting that systems 502 and 503 may be housed in the same junction box 501, in the various embodiments there are only two controllers, or in one embodiment only a single controller is used, embodying all of the functions of a two or a four controller system.

Looking to FIG. 6, an important operational parameter available to both controller A 601 and controller B 602 is the voltage V 618 of PV panel 400, sensed in common on line 617. Controller A 601 and controller B 602 must agree that the voltage of PV 400 is approximately the same from each controller's point of view and that the voltage value has remained above certain critical minimums, such as VminM1 or other minimum voltages below which danger to the PV 400 may exist. If the voltage V 618 of PV 400 fails to rise above VminM1, even though time Tp has been reduced to zero, resulting in no pulses, the Safe signal on line 616 may be de-asserted by controller B 602, thereby disconnecting the load from the PV 400. If either controller A 601 or controller B 602 detects a significant difference in the voltage V 618 of the PV 400 in common between the two controllers, or that the voltage has become critically low, this condition could indicate that the PV 400 cells may have one or more reversed biased cells, which could be subject to thermal damage. Because reversed biased cells may be dangerous due to very high heat buildup and resulting temperature, controller A 601 and controller B 602 each have independent means of disconnecting current flow from the PV 400. In the case of controller A 601, current flow may be interrupted from flowing from PV 400 by de-asserting the signal TP on line 627.

In the buck converter example of FIG. 6 only one Tp signal and one phase is shown. Multiple phases and multiple Tp signals may be used. The one or more Tp signals 627 may be driven OFF if controller A 601 detects an inconsistent voltage V 618 on line 617 from PV 400 as compared to the value measured by controller B 602, or if it detects a critically low voltage of the PV 400 that cannot be corrected. Similarly, controller B 602 has control of the signal denominated Safe on line 616. The signal Safe 616 is connected to a circuit which can disconnect current from the buck converter system 502 switching stage independently of controller A 601. Sensor 618 is connected between terminal B 506 and terminal A 505, which are connected to the PV 400. Sensor 618 provides a signal V 618 representing the voltage across terminals A 505 and B 506 of PV 400. If either controller A 601 or controller B 602 or any single point fails in the support circuitry for controller A 601 or controller B 602, such failure will not result in a reversed biased cell within the solar array, thereby providing a safe failure recovery.

There are various points within the circuit of FIG. 6 from which a voltage value is used by controller A 601 and/or controller B 602. Such values may be obtained by an analog to digital converter (ADC) at each location, or a single ADC (which may include a MUX) with an input channel connected to each measuring point. The analog voltage value may be converted to a digital representation that is then provided to each controller 601, 602 by an external ADC on the signal lines as shown. The example schematic 502 uses a sensor symbol (dv 635, di 610, V 618, Vo 629, I 607) to indicate the voltage being converted. All or less than all of the sensors may simply be a connection to a line which is further connected to the indicated input terminal at controller A 601 or controller B 602, wherein an ADC internal to the controller provides the conversion. Also, all such signals may be single-ended as shown, or differential (not shown).

Controller A 601 receives input signals di 610 and dv 635. Controller A 601 utilizes the di 610 and dv 635 signals in order to compute the small signal conductance value of the PV 400 at its instant operating point (described hereafter in greater detail).

The signal "I" 607 across sense resistor 609 provides a version of the current I 607 value to controller B 602 on line 608. The signal 1607 includes both DC and AC components. In some embodiments signal 1607 is averaged or filtered by firmware within controller B 602 or by external low pass filter elements (not shown) to remove ripple.

Continuing to look to FIG. 6, the di small signal current 610 originates from the voltage developed across resistor 609. In some embodiments other current sensing means are used. Current flowing from the PV 400 through terminal A 505 flows through resistor 609, which is in series with a safety FET 615 and a power transistor 620. In the example of FIG. 6, FET transistors are used, though other switching technologies may be employed. A buck converter 626 may comprise a plurality of buck converters configured as a multi-phase converter. To simplify the explanation, only a single converter 626 will be discussed here. The switching action of power FET 620 creates a time variant current through resistor 609. The variable current through sense resistor 609 results in a variable voltage across resistor 609 which is then coupled via capacitor 606 to a band pass filter 604. Capacitor 606 removes any direct current component from the signal developed across resistor 609. The band pass filter 604 may reject signals which did not arise from the action of power FET 620. The band pass filter 604 may be embodied in a variety of ways, such as a tank circuit, a bi-quad active filter, ceramic or SAW filter or others which will be known to one skilled in the art. In one embodiment the band pass filter 604 comprises a National Semiconductor part number MF10, enabling controllers A 601 or B 602 to provide a time base to band pass filter 604. Having controller A 601 or controller B 602 provided a time base signal to band pass filter 604 has the advantage of allowing band pass filter 604 to track with changes in frequency of operation of controller A 601 and controller B 602. If switched capacitor techniques are used, the filter may be configured to sub-sample, effectively digitally down-converting a di signal 610 to a lower frequency. Note that applying such sampling technologies requires the use of analog anti-aliasing low pass filters to prevent unwanted higher frequency signals from being "folded" into the filter's band pass. The switching frequency of signal Tp on line 627 and/or the operational frequency of controller A 601 and controller B 602 may be varied. An optional pseudo-spread spectrum technique may spread electromagnetic interference, thereby reducing the energy at any one tone and providing a reduction in radio frequency interference to surrounding equipment.

The signal from the band pass filter 604 may be restricted to an amplitude modulated tone of approximately the switching frequency of FET 620. The circuit comprised of resistor 609, capacitor 606, band pass filter 604, peak detector 605, and sensor 610 may be configured as shown, or all or less than all of the individual circuit elements may be combined into an integrated circuit element. As one skilled in the art will know, each individual circuit element of band pass filter 604 and peak detector 605 may be expanded to a series of individual components to implement a similar function. In some embodiments differential signals are provided by connecting both terminals of resistor 609 to band pass filter 604. Differential signals resulting from band pass filter 604 may be connected to two differential inputs on peak detector 605. Similarly, sensor 610 may be single-ended as shown or may be differential by being connected across differential outputs of peak detector 605, which may be a differential peak detector. The signal Safe on line 616 from controller B 602 drives transistor 615 through an optional level translator 614.

The disclosed concept uses a capacitor to block the DC component, which is an alternative means to a transformer. Likewise a band pass filter isolates the frequency of interest, which is an alternative to synchronous sampling. The peak detector is used to measure the peak to peak signal, which is an alternative to integrating and calculating the peak to peak signal values.

Controller A 601 provides a pulse signal denominated as Tp on line 627. The signal Tp drives transistor 620 through a level translator 640. The signal Tp provides a power pulse for a buck switching power supply 626 comprising the power transistor 620, diode 622, coil 621, and output smoothing capacitor 642. In the various embodiments the switching power converter 626 is replicated a number of times, forming a multiphase power converter. In such embodiments controller A 601 provides a plurality of TP signals on a matching number of lines as line 627, wherein each individual supply 626 is provided an individual signal Tp. The family of Tp signals are typically of the same time duration, offset in time. In some embodiments the number of Tp phases is equal to or greater than the ratio of the PV 400 voltage across output terminals A 405 and B 406 to the output voltage O+, O− (508, 509). For example, in one embodiment, four power converters 626 are driven by four separate Tp signals on four lines 627, each Tp signal ninety degrees out of phase with its neighboring Tp signal such that they are equally spaced across a switching period. A multiphase design can be advantageous by providing reduced ripple on the output signal (O+, O− 508, 509), as well as reducing the value of capacitance needed for smoothing capacitors 642.

Controller A 601 receives peak detector 633 output signal dv 635 on line 634. Signal A 505 is connected with capacitor 631 by line 646. Capacitor 631 is in series with band pass filter 632, which is in series with peak detector 633.

Large signal, or "total" conductance is nonlinear. However the small signal conductance is linear over a small range. In that region, dv drives di through the power source, thus the shape of the di signal is the same shape as the dv signal. Therefore the ratio of any AC component of di to the same AC component of dv will be identical to each other. For example, $(di_{P-P}/dv_{P-P})$ would be the same as $(di_{RMS}/dv_{RMS})$ or the integral of di over the integral of dv (over a common time period, for example the frame time T) as well as any of these ratios scaled by the same value for both di and dv.

Internal voltage supply ("IVS") 603 provides power to controller A 601 and controller B 602 and any other active components such as those that may be related with band pass filters 604 and 632, peak detectors 605 and 633, level translators 614 and 640, or their counterparts. IVS 603 may be a single-chip or a discrete power supply. The output terminal 637 may be single or multiple output terminals providing the same or different voltages for controller A 601, controller B 602, and other elements within the circuit 502 as is needed by each component. In some embodiments IVS 603 is implemented as a number of separate power supplies.

An example of a boost converter system 503 according to concepts of the present disclosure is shown in FIG. 7. The circuit of FIG. 7 is very similar to the circuit of FIG. 6. Those elements in FIG. 6 that are in common with corresponding elements of FIG. 7 are not repeated here. The notable difference between the circuit of FIG. 6 (502) and that of FIG. 7 (503) is the provision of a boost type power converter 707 versus the buck converter 626 of FIG. 6. The boost converter 707 is well known to those skilled in the art. As disclosed regarding the buck converter 626, the boost converter in FIG. 7 may be a single converter as shown, or a multiphase converter as previously disclosed and described, but not shown in the figure for clarity of description. Power converter 707 may be a buck-boost or an inverting boost converter. In such a case, the boost converter 707 takes what may be a negative voltage with respect to terminal B 506 and converts it into a voltage positive with respect to terminal B 506 such that this positive voltage is connected in parallel with buck converter 626 (FIG. 6).

As stated previously, the example of two controllers 601, 602 is but one example. More than two, or only one controller comprising the functions of controller A 601 and controller B 602, may be used. For simplicity in description, "controller 690" will hereinafter refer to the controller function of controller A 601 and controller B 602, with the understanding that the controller 690 represents any number of controllers for the systems 502 and 503.

An example of an aspect of a method for the prevention of hot spots in a solar panel is the apparatus within J-box 501, electrically controlling the solar panel, which executes a process for controlling the operating condition of a solar panel 400. The method is useful for hot spot elimination on both standard solar panels, for example PV 100, as well as a solar panel fabricated according to the principles of the disclosure PV 400. One benefit derived from the use of the inventive concept is the elimination of the need for bypass diodes in the construction of a solar panel, though the concept may be used with a solar panel that does include bypass diodes. In addition, solar panels constructed according to the concepts disclosed herein may be manufactured using individual solar cells which are known to have a low avalanche breakdown voltage characteristic. Such cells are not useable in the prior art because bypass diodes cannot effectively prevent their destruction in a partial-shading condition.

The steps of the inventive method will be discussed, then the results of the method in the various conditions a PV 400 may experience described. The method may be applied to any solar panel, with or without bypass diodes. For simplicity and clarity or description, the processes 800 and 900 will be disclosed as controlling a PV 400 without diodes, but the reader will understand that the processes are not so limited but rather apply to a conventional PV 100 as well. Likewise, a PF 100, 400 may be described as being controlled by an inverter, though the external controller may be an inverter, array converter, microinverter, or other device.

Using essentially the same apparatus, as disclosed herein and exemplified in FIG. 5, FIG. 6, and FIG. 7 the method of controlling a PV 400 may or may not include controlling the PV 400 to is maximum power point condition, or "MPPT."

Such will be disclosed as two cases. In the first, an external electronic device, for example an inverter, searches for the MPPT condition. In the second case the apparatus 500 controls to the MPPT condition.

Case 1: PV not Controlled for MPPT Condition

In a Case 1 embodiment the control apparatus 500 does not attempt to control to the MPPT condition, but rather to prevent an external inverter or other device from causing damage to the PV 400 as the device experiments to determine the MPPT condition.

A strategy of the methods 800, 900 is to compare the small signal conductance of a PV 400 to its large signal (or total) conductance. Note that small signal conductance is a pure AC signal, which is directly determined by the controllers 502, 503. The total conductance of a series of circuit may be found by a formula similar to that for finding the total resistance of a plurality of parallel resistances:

$$S = \frac{1}{\frac{1}{S_1} + \frac{1}{S_2} + \dots \frac{1}{S_n}},\qquad [\text{EQ1}]$$

wherein S is the conductance of a string of electrically series connected cells, where the conductance of a given cell may be given as I/V. In the circuit of FIG. 6, the total conductance of a PV 400 panel corresponds to the value of I 607 divided by the value of V 618.

The small signal conductance of series-connected cells has the same relationship as in EQ1, wherein the small-signal conductance of a given cell may be found as di/dv. Note that di/dv is an AC signal with no DC component. Again using the example of FIG. 6, the small signal conductance of a PV 400 may be found as the ratio of di 610 divided by dv 635. From the relationship EQ1 one can see that a very low value of conductance or low value of small signal conductance in any given cell becomes dominate in the total. As will be seen hereinafter, the small signal conductance of a partially-shaded cell becomes considerably lower than that of cells receiving full insolation, thereby providing a signature which may be used for controlling a PV 400 such that a partially-shaded cell will not be driven into a reverse bias condition. Accordingly, a solar panel so controlled may be constructed without bypass diodes and not experience hot spot problems. In its most general terms, the disclosed method monitors small signal conductance and takes action when a weak cell(s) is detected, thereby preventing its destruction.

Figure 8:
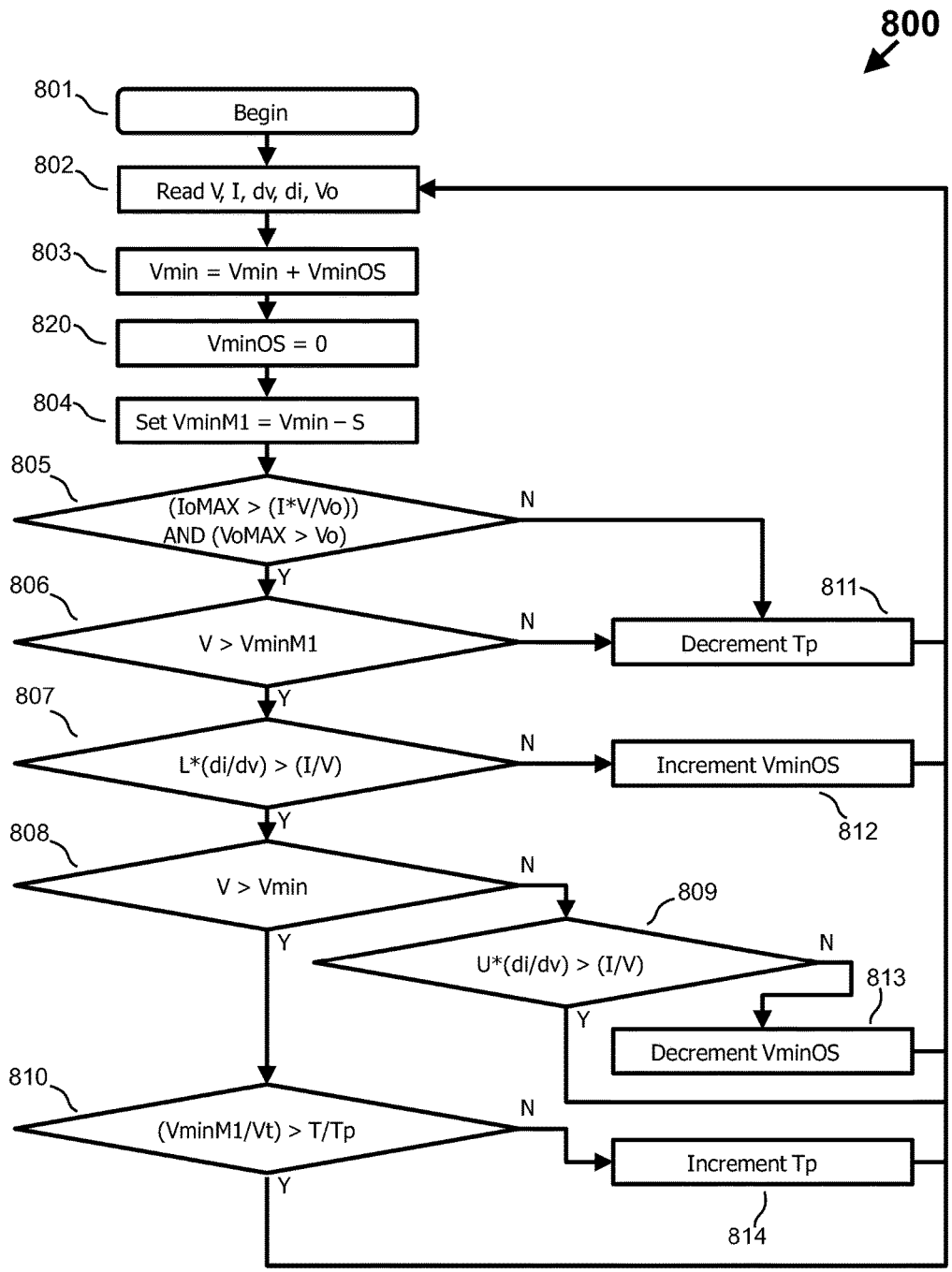
FIG. 8 is a flow chart of an exemplary control method for a buck converter.
Figure 9:
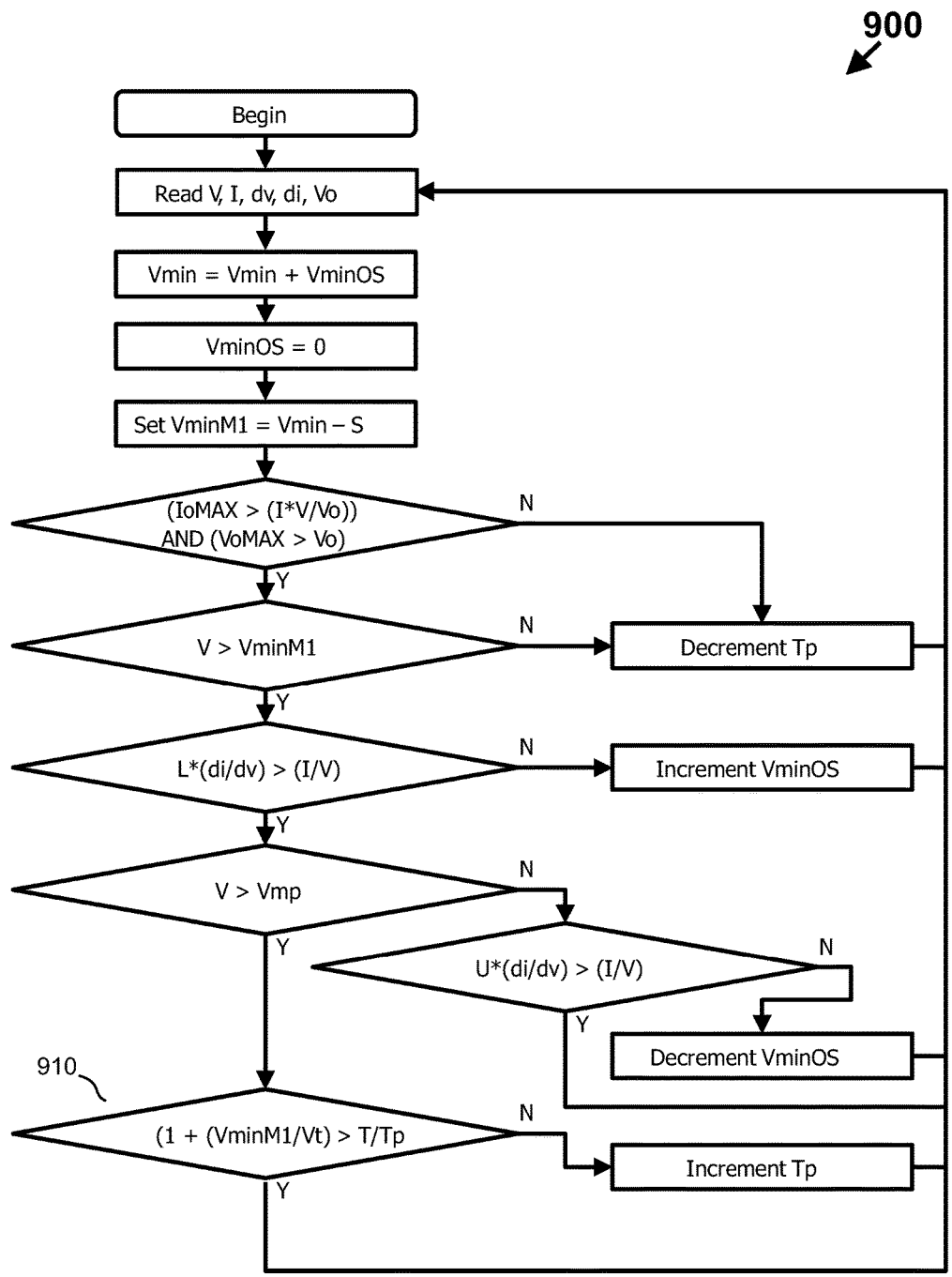
FIG. 9 is a flow chart of an exemplary control method for a boost converter.

A buck converter and a boost converter require different control methods. Accordingly, the buck system 502 may be controlled in accordance with process 800 (FIG. 8) and the boost system 503 may be controlled in accordance with process 900 (FIG. 9). Turning first to process 800, the processing steps shown in FIG. 8 are carried out by the controller 690. The controller 690 may be a programmed process, a state machine, random logic, FPGA, or any other device capable of sensing values, making decisions, and taking action. In some embodiments the controller 690 comprises a processor, executing a program stored in an electronic memory device.

In a Case 1 scenario, the control method 800 constantly strives to keep small signal conduction above a predetermined minimum value, for example one eighth of the large signal conduction (I/V) value. Operation at a lower value may lead to damage of one or more cells. As will be detailed hereinafter, the method insures that an external controller, for example an inverter or a PAMCC of an array converter, cannot create a condition that would be damaging to a weak cell. The controlling mechanism of process 800 is the drive time of the signal Tp of the buck converter FET 620.

Looking to FIG. 8, at step 802 the PV 400 cell array voltage V 618, current I 607, dv 635, di 610 and output voltage Vo 629 are read or determined. The instant value of electrical current I 607, which in one embodiment may be the current of the cells connected between terminals 405 and 406 in FIG. 4, may be determined by sensing the value of the voltage across the sense resistor 609, or in an alternate embodiment, may be computed, in that it is directly related to the Tp timing generated by the controller 690 wherein the current in inductor 621 is discontinuous.

For example, in a buck power converter, the current I 607 may be determined by the formula:

$$I = \frac{Tp(V-Vo)}{2T*L}, \quad \text{where} \qquad [\text{EQ2}]$$

$$Tp = \frac{T*Vo}{V}. \qquad [\text{EQ3}]$$

The current I may alternatively be determined using a current transformer. In another aspect, the current flowing within the PV 400 may be determined by first finding the apparent PV 400 output voltage ($V_{AB}$) by the formula:

$$V_{AB} = \frac{T*Vo}{Tp}, \qquad [\text{EQ4}]$$

where $V_{AB}$ is the voltage across the PV 400 nodes A 405 and B 406. The approximate current may then be determined by taking the difference of the calculated apparent voltage $V_{AB}$ of the PV 400 and subtracting the measured voltage V 618. The total resistance of the inductor, transistors and diode may then be divided into the voltage difference ($V - V_{AB}$) in order to estimate the current I 607. Other inventive concepts may use a hall effect current sensor or other means that would be known to one of ordinary skill in the art.

One skilled in the art would know to modify EQ1, EQ2, EQ3 and EQ4 appropriately for the boost converter 503.

In some embodiments the circuitry from the capacitor 631 through the voltage developed from peak detector 633, denominated dv 635, is not used to determine dV. Instead it may be shown that dV may be determined by the relationship $$dV = Tp^2(V-Vo)/8LC, \qquad [\text{EQ5}]$$

where V is panel voltage V 618, Vo is power converter output 629, L is the value of the power converter coil 621, and C is the value of the panel smoothing capacitor 636. So, V and Vo are read at step 802, Tp is known, and L 621 and C 636 are known from their specifications, calibration of the apparatus 501 during manufacturing, or recalibrated by the system from time to time to account for aging.

At step 803 a minimum voltage is determined by adding an offset value VminOS to a previous value of Vmin. At startup or reset, an initial value Vmin is arbitrarily set. In some aspects, Vmin may initially be a few volts below the open circuit voltage of the panel. For example, if the panel measured 100V with Tp=0 (OFF) then Vmin could be set to 98V, well above where it will ultimately be. The action of the control method 800 will "walk" Vmin down to where it needs to be in operation.

VminOS may initially be zero at Begin step 801, whenever the controller 690 is reset, or when the system is turned ON, for example at sun rise. The value of VminOS, once used at step 803, is reset to zero at step 820. At step 804, the value of VminM1, a guard banded version of the approximate Vmin condition, may be calculated by subtracting the value S from the instant value of Vmin. For example, the value of S may be 0.5 V. Other guard band values may also be used, including zero.

At step 805, output current is compared to a predetermined maximum current, IoMAX, for example 8 A, and the output voltage Vo 629 is compared to a predetermined maximum output voltage VoMAX, for example 40 VDC. In various embodiments system output current Io is measured directly by any of many well-known current sensors (not shown). In the example circuit 502, output current Io, which is not sensed directly, may be found by scaling PV 400 current I by the ratio of voltages (Vo/V). If either Io or Vo 629 exceed their predetermined maximums, step 811 checks to see if the length of time Tp is asserted is greater than zero and, if so, decrements the length of time Tp is asserted. From step 811, the process returns to step 802 and the step 802 to 811 loop continues until the test at step 805 passes. At step 811, if the value of TP is found to already be zero, an error condition may exist, and the Safe signal on line 616 may be de-asserted by the controller 690 to protect the PV 400. If the value of Tp is reduced, it reduces the average current Io delivered to the output by the buck converter 626, thereby reducing the load on the PV 400, which would be expected to cause the value of the voltage V 618 of the PV 400 to also decrease, as may be seen from EQ2 and EQ3.

The FET 620 ON (or "drive") time Tp may determine the duty cycle of the power converter 626. In the various embodiments T and Tp may be controlled by a timer in the processor, for example Controller A 601. The timer may be a sixteen bit timer, and the time Tp increased or decreased by incrementing or decrementing the timer time out value. In some aspects the resolution of this time may be approximately 4 nSec. Timers of different bit widths and clock rates may be used, in that it is duty cycle that is the controlling factor of the power converter 626 output voltage.

When the test at step 805 passes, processing moves to step 806. The voltage V 618 measured across PV 400 is compared to the instant value of VminM1. If the voltage is found to be above VminM1, processing may continue to step 807, otherwise to step 811 to decrement the time value of TP, then repeated from step 802 as previously disclosed until the test at step 807 passes. Recalling that VminM1 is a guard banded version of the approximated minimum voltage Vmin, step 806 insures that the instant voltage V 618 is no lower than the target value of Vmin than by the amount S, which was applied at step 804.

In various aspects of the inventive concept, the small signal conductance is controlled to prevent it from attaining a value of less than (I/8V). So, at step 807 the value di/dv (using the values di 610 and dv 635 or their calculated values) is scaled by the factor L=8, then compared to the ratio I/V (as found using I 607, V 618), thereby testing to determine that (di/dv) is above its lower value boundary.

Figure 12:
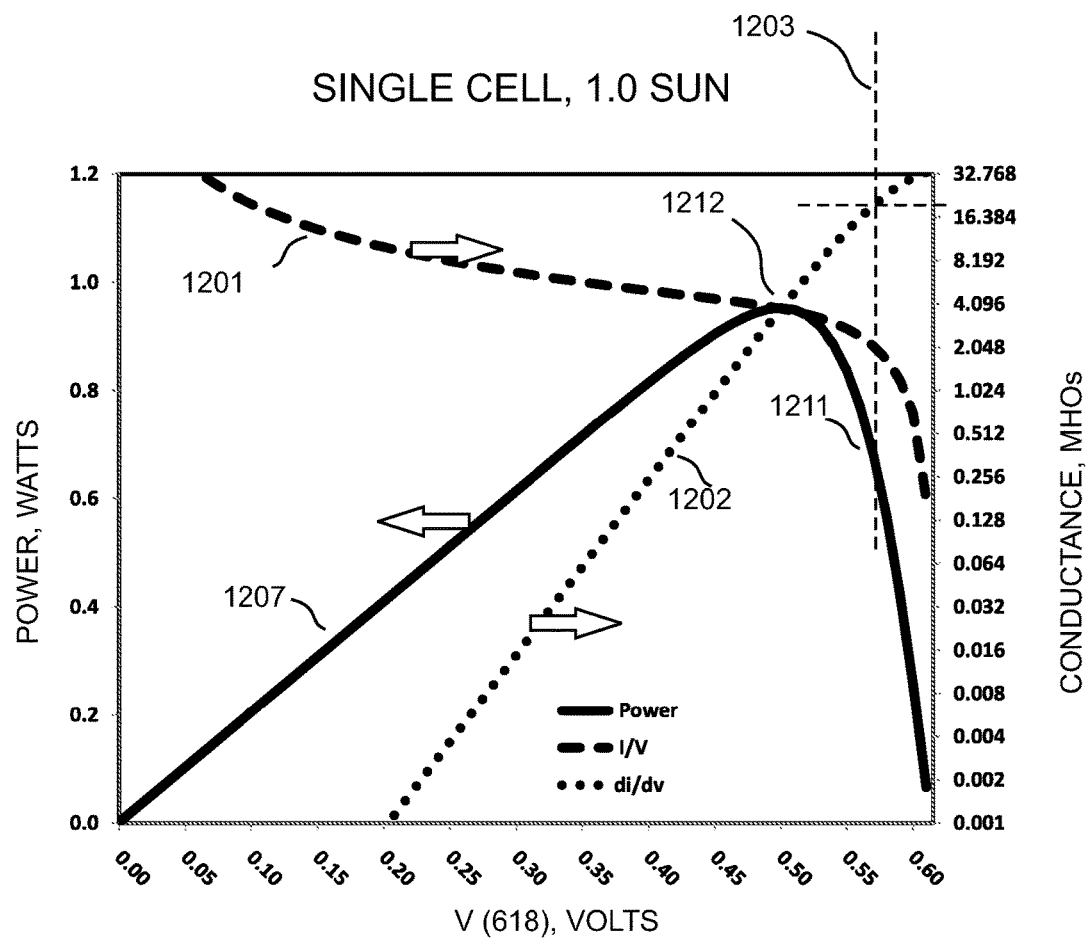
FIG. 12 is a graph of an exemplary response curve for a single one-quarter solar cell at 1.0 sun.

If the test at step 807 fails, indicating that small signal conductance is too low, step 812 increments VminOS and returns to step 802. The VminOS term may be incremented by some small amount, for example by 10 mV. Other values may be selected. Increasing VminOS increases the value for Vmin at step 803, thereby increasing VminM1 at step 804. As can be seen in FIG. 12, an increase in V 618 drives I/V (1201) lower and di/dv (1202) higher.

Examining the chart shown in FIG. 12, we see that when the quantity di/dv is small relative to I/V, the voltage operating point of the cell may be below its optimum point (1212) and at some extreme could result in negative voltage operation of the cell. Note that di/dv may be a very sensitive indicator of the voltage of operation of the cell and therefore a guard band of eight (L) as in this example results in a significant guard band to avoid miscalculation and noise effects. However this guard band does not result in a band that may be so large that any significant reverse bias could occur within the cell. Step 812, incrementing VminOS, will ultimately result, through the processing steps 802 and 803, in the calculation of a new value for Vmin, which may be higher than had been previously calculated, thereby increasing the voltage V 618 at which test 806 fails. When step 806 fails, step 811 will decrement Tp and therefore the amount of current required from the PV 400 may be decreased. This means that increasing the VminOS in step 812 will ultimately result in reduced load on the PV 400 and increased voltage of operation. In the case wherein the test at step 807 passes, processing continues at step 808 by comparing the voltage across the PV 400 to the approximated Vmin, recalling that Vmin may be approximately 0.5 V ("S") above VminM1 in this example. When the test at step 807 passes, control passes to step 808.

If the test at step 808 fails, a subsequent test at step 809 reexamines the relationship between di/dv and I/V. In this example, the quantity used to create a guard band is four ("U"). Other values may be selected. U must always be a smaller value than L. With U at four the test at step 809 will pass for values of di/dv that are at least greater than one fourth of the value of I/V. In the case that the test at step 808 passes, processing continues at step 810.

If the test at step 809 passes it means that the quantity di/dv is at least above the value of one fourth of I/V and in that event no action is taken and processing resumes from step 802. In the event that step 809 fails, the process continues at step 813 which results in a decrement of VminOS. This may be the result of the ratio di/dv being somewhat greater than ⅛ of I/V and less than one fourth of I/V. In that case, it may be reasonable to decrement the VminOS, which will ultimately result in the PV 400 operating at a slightly lower voltage when processing resumes at step 802. If the test at step 808 passes, processing continues at step 810. The test at step 810 examines the ratio of VminM1 to a target voltage Vt.

If the ratio of the voltages (step 810) is greater than the ratio of the total time of the cycle (T) divided by Tp (which corresponds to the inverse of the duty cycle of the power converter), processing continues from step 802. Passing the test at step 810 indicates that the instant duty cycle is sufficient for the PV 400 to operate near its minimum voltage point with the target output voltage. The tests at steps 807 and 809 and the comparison with the value of VminM1 810 may indicate that the PV 400 is operating at a slightly lower voltage than its optimal point, indicating that an external inverter (not shown) can seek a higher voltage which will develop a slightly higher voltage at the array of PV 400 cells. A true maximum power point may be determined by the algorithms within the external inverter which may be connected either directly to the output terminals 512 and 513 of FIG. 5 or to other series connected PVs which in turn are connected to output terminals 512 and 313.

Failure of the test at step 810 may indicate that additional power may be safely extracted from the PV 400 since the voltage may be above Vmin and the system is not yet at the maximum duty cycle allowed to achieve both Vmin on the PV 400 and Vt on the output. In this case step 814 increments Tp. Incrementing Tp will increase the power derived from the PV 400 and therefore move the PV 400 voltage lower and possibly closer to its maximum power point, thereby enabling the external inverter to more readily attain the MPPT condition. One skilled in the art would recognize that, due to the volt second balance principle, the ratio T/Tp is the same as the ratio V/Vo. Also, Tp/T is the duty cycle of a switching power supply.

When the test as step 810 passes, control simply begins again at step 802. In some embodiments, the processing of the buck process completes every switching cycle. In other embodiments, processing occurs at intervals of time, which may comprise many switching cycles. In other embodiments processing occurs when one of the measured quantities changes. The quantities of V 618, dv 630, di 610 and 1607 may be averaged, median filtered, low pass filtered or otherwise filtered for noise by other means.

In summary, if the voltage across the solar panel becomes too low (806) Tp is decremented (811) to reduce the load on the solar panel enough times for V to eventually exceed VminM1. Then, L*(di/dv) is compared to I/V (807), where "L" is the lower limit. If L*(di/dv) is less than or equal to I/V then PV 400 is on the low voltage side of an ideal point on the IV curve by at least an L margin, indicating small di and/or large dv values. A small value of di indicates nearly constant current. A large value of dv also indicates constant current, therefore operation on the left side of the IV curve. This indicates trying to extract more current than can be safely produced without reverse biasing a cell. In response, VminOS is increased (812), thereby increasing Vmin. Increasing Vmin increases VminM1. This loop is continued until V attains a value below the now-increased VminM1 at which time Tp is decremented (811), reducing the current, thereby increasing V, until L*(di/dv) vs I/V is tested (807) at the new lower current level.

Eventually the current decreases enough that the L*(di/dv)>I/V test (807) passes. If the voltage is less than or equal to Vmin (808) then we check to see if we have gone too far toward lower current. That is, if U*(di/dv) is less than or equal to I/V (809) it indicates that I/V is between U*(di/dv) and L*(di/dv). Note that both Udi/dv and Ldi/dv are below I/V values associated with the maximum power condition, and therefore below Imp/Vmp. Since the objective is to keep the inverter from damaging the panel, we can let it increase current so we reduce VminOS which in turn reduces Vmin which in turn reduces VminM1.

Eventually Vmin will be reduced below V or the inverter may reduce its demand for current. If the inverter reduces its demand for current so that I/V is below both Ldi/dv and Udi/dv, and V is above VminM1 and below Vmin we need not do anything more. This is what the inverter should be doing if it is seeking Mpp.

If we reduce Vmin to below V before Udi/dv becomes greater than I/V it means we could let the inverter try for more current so long as the output voltage is not over Vt. Here we increment Tp which will increase current which in turn will cause di/dv to fall, V to fall and I/V to increase.

Process flow 900, as shown in FIG. 9, has identical processing steps to process 800 with the exception of processing step 910. Step 910 relates the nominal output voltage to the instant duty cycle and is the appropriate response for a boost converter, which may be a different equation than for a buck converter. With the exception of step 910, the processing steps of FIG. 9 are identical to the processing steps of FIG. 8, and thus are not repeated here.

Case 2: PV Controlled for MPPT Condition

In some aspects of the disclosure the controller 500 controls the PV 400 to its MPPT condition. In this case the external inverter may be configured to not attempt any actions (experiments) for attaining MPPT. In other embodiments the external inverter may take actions to drive to the MPPT condition, but the experiments may find that the PV 400 is already in the MPPT condition. Note that the inverter does not and need not have any knowledge of the controller 500 or its actions; the inverter may simply perceive the PV 400 as an ideal solar panel, persistently at its maximum power condition.

Figure 19:
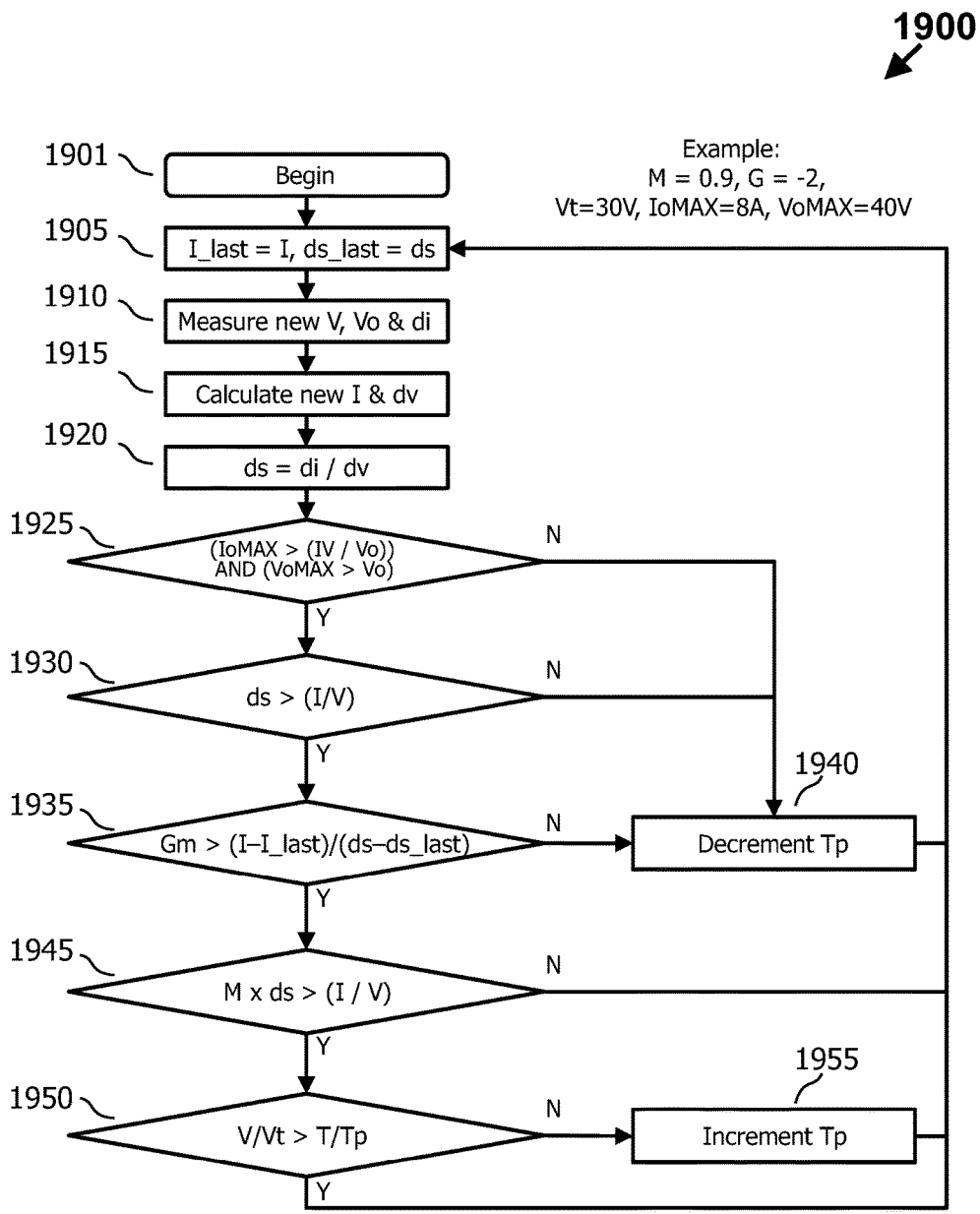
FIG. 19 is a flow chart of an exemplary control method for a buck converter.

Turning to FIG. 19, note that many terms are reused here from the disclosures related to FIG. 8 and FIG. 9 and their explanations and alternatives are not repeated here. We define a new term "ds" for the small signal conductance di/dv, the determination of which has been previously discussed.

Initial conditions are assumed at Begin 1901. For example, in one aspect an initial power of one watt is targeted, which would be a totally safe power level. As discussed previously, the open circuit voltage V of a PV 400 is found by setting Tp=0 (OFF). In but one example the voltage V is found to be 100 volts, then for one watt the current I would be targeted for 10 mA and the appropriate Tp found from EQ3, wherein Vo is found using standard volt-second-balance equations and the known component values. This process could continue until the voltages settled down, then current I saved and ds found and saved, then processing passes to step 1905.

As processing loops through step 1905, the instant (that is, previous) value of I is saved to a variable I_last and the instant value of ds saved to a variable ds_last. Then at step 1910 new values are determined for V, Vo and di per methods previously discussed. From the values found at step 1910 a new value for I and a new value for dv is found. An instant value for ds is then calculated at step 1920. As with processes 800, 900 the current I is compared to a maximum, for example 8A, and the output voltage Vo is compared to a maximum, for example 40 VDC, at step 1925 and Tp decremented 1940 if either value is over limit. The process repeats from step 1905 until the test at step 1925 passes, then control passes to step 1930. Step 1930 tests for conductance (I/V) to be less than the instant ds and, if not, decrements Tp 1940 to decrease conductance and increase small signal conductance (ds) as was seen herein before in FIG. 12. This process repeats from step 1905 until step 1930 passes.

When step 1930 passes we compare the rate of change of current to the rate of change of small signal conductance. To do this we find the change in current by (I−I_last) and the change in small signal conductance as (ds−ds_last) and test for a ratio that is less than some value of transconductance Gm, for example −2. The value of Gm is a negative number because di/dv decreases as I increases. Increases in I force PV 400 to shift its operating point up (higher current) and to the left (lower voltage). The left portion of the IV curve (lower voltage direction) is where current tends to become constant which tends to make di/dv small. The test at step 1935 failing is an indication that ds is changing too rapidly with I, so current is lowered 1940 to move towards a safer condition by decrementing TP and repeating the process from step 1905.

With the PV 400 safely in control, step 1945 tests for a condition of ds greater than total conductance (I/V) by a factor "M", for example M=0.9. If the test at step 1945 fails the PV 400 is either at the maximum power point or on the high voltage side of it, so no action is needed and processing returns to step 1905. If test 1945 passes, control passes to the test at step 1950, comparing the ratio of V and a target voltage Vt to the ratio of T and Tp. If V/Vt is not greater than T/Tp the system is on the high voltage side of MPPT and Vo is at or below Vt, so Tp is incremented 1955 and the control loop begins again 1905. When the test at step 1950 passes the system is both on the high voltage side of MPPT and Vo is above Vt, in which case nothing is changed and the loop begins again at step 1905.

As with the FIG. 9 process 900 relative to the FIG. 8 process 800, wherein only a small modification is required for a boost process instead of a buck converter process, the process for MPPT FIG. 19 is appropriate for a buck converter 502. For a boost converter 503 only step 1950 is different. That is, step 1950 would read $$(1+(V/Vt))>T/Tp$$

when the process 1900 is to be executed by a boost converter 503.

In the various embodiments a flow 1900 comprises fewer steps than shown in FIG. 19. For example, in one aspect step 1925 is eliminated, sacrificing some safety for simplicity. In another aspect step 1930 proceeds to step 1945, thereby making step 1945 a termination condition wherein the process loops to there and returns when operation is normal and steady state. In another aspect step 1925 (if used; otherwise from step 1920) proceeds to step 1935, and steps 1930 and 1045 are not used, thereby making step 1935 the termination condition. Note that step 1935 defines a condition corresponding to the maximum power condition.

Figure 10:
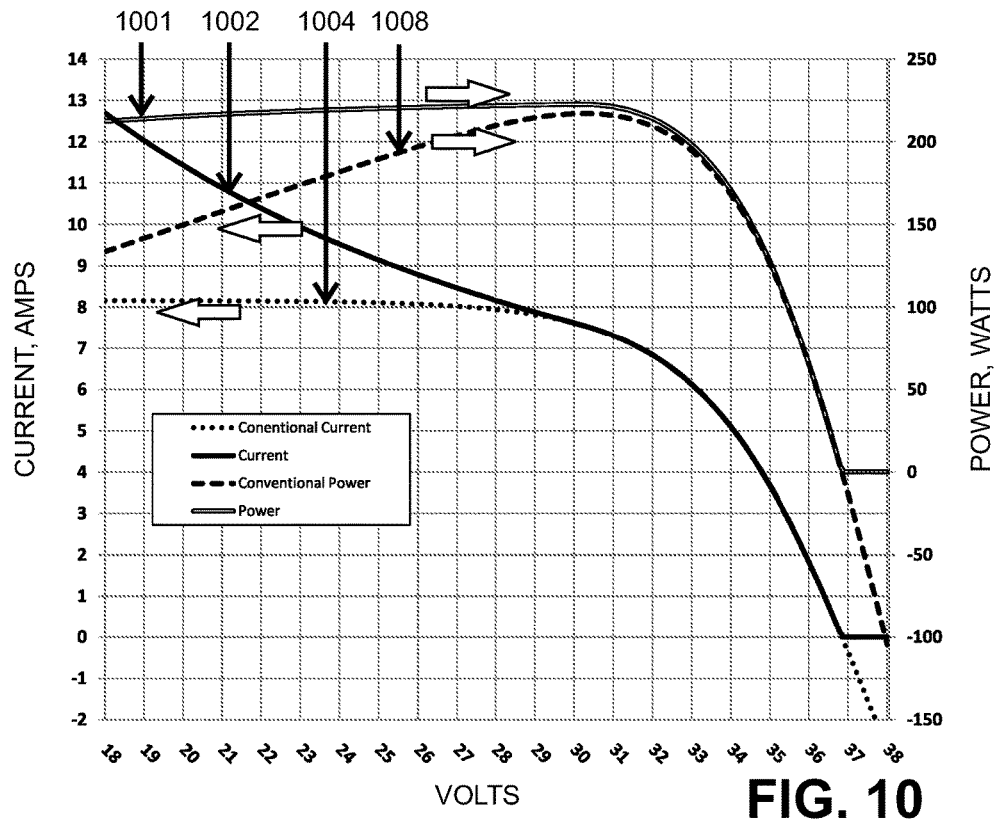
FIG. 10 is a graph of response of an exemplary control system.

The chart of FIG. 10 relates the current and power versus voltage as seen at terminals 512 and 513 of FIG. 5. The response shown may be for a single buck converter as shown in FIG. 6 processing according to the process 800. The control response would be similar for the combination of boost 503 and buck 502 converters driving the output terminals O+ 512 and O− 513 per FIG. 5.

In FIG. 10 the current 1004 and power 1008 of a conventional PV 100 are compared with the current 1002 and power 1001 of a PV 400/controller 502/controller 503 system, hereinafter referred to as "the inventive concept." In some embodiments of the present inventive concept the power 1001 remains essentially constant for voltages below the target voltage Vt. In the example of FIG. 10 the value Vt was set at 30 V. In order to maintain a constant power as the voltage across the outputs of the system 500 decreases, the current increases as the voltage falls. The current response curve 1002 resembles a PV with what is referred to in the related art as having a "poor fill factor"; that is, a current that increases with decreasing voltage and decreases with increasing voltage. Solar panels with poor fill factors make the task of finding the maximum power point easier for an external inverter's algorithms by providing a large region of voltages and currents that provide close to the actual maximum power point as determined by the inverter. The well known production of input ripple is an undesirable, but inevitable side effect of inverters. The ripple causes a loss of power in high fill factor prior art solar panel with a distinct maximum power voltage and current point. The inventive concept produces maximum power over a wide region of voltages and currents, so that the current ripple imposed by the inverter on the inventive concept does not result in a power loss.

Examining the chart of FIG. 11, we see that the PV 400 delivers optimal power when voltages are applied that are approximately equal to or below the threshold voltage, which for this example may be set to 30 V. This is the term "Vt" as used in the processes 800 (FIG. 8) and 900 (FIG. 9). It is worth noting that this voltage may be set higher or lower in other embodiments. For example, a target voltage Vt may be chosen such that the response may be compatible with conventional solar panels in a common string. Response may automatically compensate for variations in temperature such that the optimal power may be always delivered at approximately Vt. As the temperature of the system increases, the power available tends to decrease.

The resulting operation of a solar panel, controlled according to the inventive concepts embodied in FIG. 5, FIG. 6, FIG. 7 and processes 800 and 900 may be understood by examination of FIG. 10 through FIG. 16. FIG. 10 is a comparison of the control response of a conventional (i.e., according to the prior art) solar panel and a solar panel controlled according to the concepts disclosed herein. In the prior art, an inverter controls a single PV or a string of series-connected PVs. According to the present disclosure, a PV (whether conventional 100 or inventive 400) is electrically connected to the apparatus of at least FIG. 6. A panel with only one bank of cells may be controlled with just the buck controller 502. Panels with a plurality of cell banks may need a plurality of controllers, for example, Bank1 408 and Bank2 404 controlled by controllers 502 and 503 respectively.

Note that in an embodiment according to the inventive concept, when the voltage across terminals 512 and 513 has increased to a point wherein the output current reaches zero (1010), the output does not consume power for still higher voltages, shown as region 1012. For a conventional solar panel 100, controlled only by a typical inverter, the current response curve 1004 and the power response curve 1008 continue into a negative range (region 1014) at higher voltages, where significant amounts of power may be consumed by the PV 100.

Consider now the interaction between an inverter, a PV 400, and the disclosed system 500 as controlled per the disclosed methods 800, 900. From time to time, an inverter may test for a better maximum power point condition by either increasing or decreasing the operating point (voltage) of the system and looking for an improved power output. With photovoltaic panels (100, 400) being current sources, an inverter can change the operating point by changing the output voltage Vo across terminals 512, 513. Looking to FIG. 11, we see a transient response 1101 resulting from the inventive concept for a series of voltages 1102 across the output terminals 512 and 513 in the shape of a triangle wave. The voltage excursion may be caused by a maximum power condition experiment by the inverter.

Consider first that the inverter starts a test cycle by increasing output voltage Vo (1102). Prior to the excursion, power 1101 is at 100% of maximum power. As the inverter changes the operating condition of the panel 400, power 1101 begins to decrease. The solid line 1101 indicates the output power as a portion of the maximum output power possible, therefore the line 1101 indicates 0% change when the PV 400 is producing its approximated maximum power and a negative value when the PV 400 is producing less than maximum power by the amount indicated. The graph relates response across a time in milliseconds that the voltage 1102 is seen at terminals 512 and 513 (FIG. 5) due to actions of the inverter. As voltage 1102 rises, power 1101 decreases, therefore the inverter will stop looking for a better maximum power condition at higher voltages, and return the output voltage to its starting point, thereby returning the output to is maximum power point. Note that the power 1101 does decrease as the inverter increases PV 400 voltage V above the point Vt, thus indicating that an external inverter is enabled to throttle back a PV 400 when necessary.

For the case wherein the inverter tests using a lower voltage, FIG. 10 indicates that, unlike a conventional PV 100 without benefit of the disclosed system, power output 1001 will remain steady. As voltage goes down (X-axis, FIG. 10), the current 1002 will increase, thereby providing for the flat power curve 1001.

However, an inverter may continue lowering the voltage until current 1002 exceeds a predetermine maximum value, IoMAX. As previously discussed, when the current 1002 exceeds IoMAX, the control methods 800, 900 react (step 811) by decrementing the time value Tp, thereby lowering the current. Thus power will decrease as voltage decreases further (because current is limited to IoMAX), so the inverter would stop decreasing voltage and return the system to a maximum power condition. As a result, the methods 800, 900 may provide the inverter a much wider range of voltages wherein maximum power may be achieved.

Figure 11:
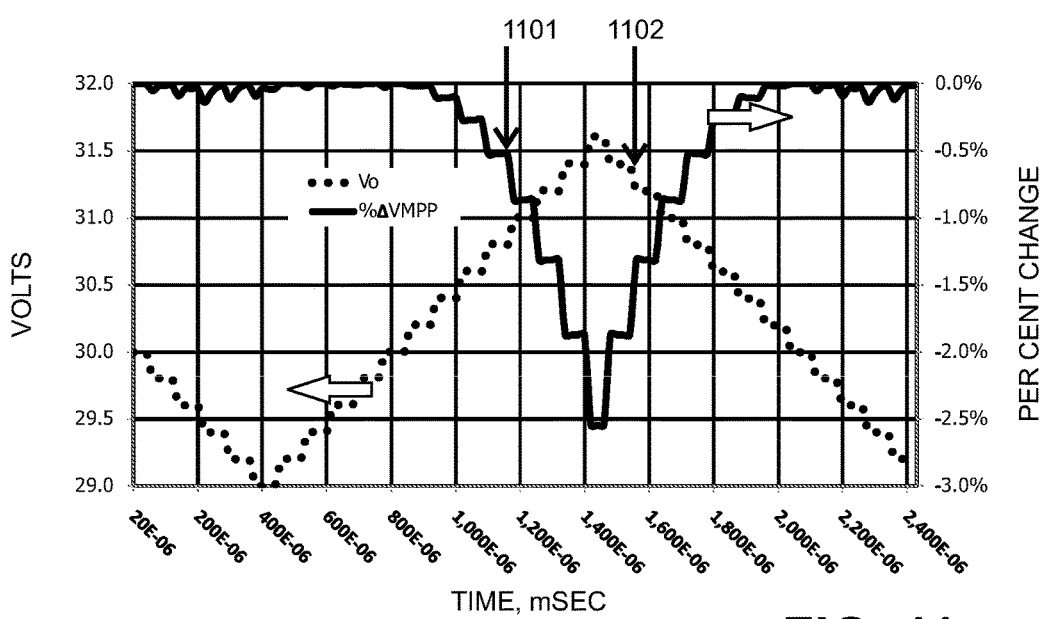
FIG. 11 is a graph of a transient response of an exemplary control system.

The transient response shown in FIG. 11 also shows that for voltages above a selected Vt value, power falls to lower levels than the optimal power the PV may be capable of producing. This characteristic confirms that an externally connected inverter will be able to throttle back the power output of PVs embodying the present inventive concept without the inverter having knowledge of its existence by the inverter increasing voltage above Vt.

FIG. 12 shows the response of a single cell illuminated by one sun insolation, relating conductance 1201 (I/V) in MHOs, change in conductance 1202 (di/dv), and power 1207 in watts as a function of output voltage Vo across terminals 512 and 513. Note that both the maximum power for the PV 400 and the intersection of response lines 1201, 1202 occur at the same voltage, point 1212.

Figure 13:
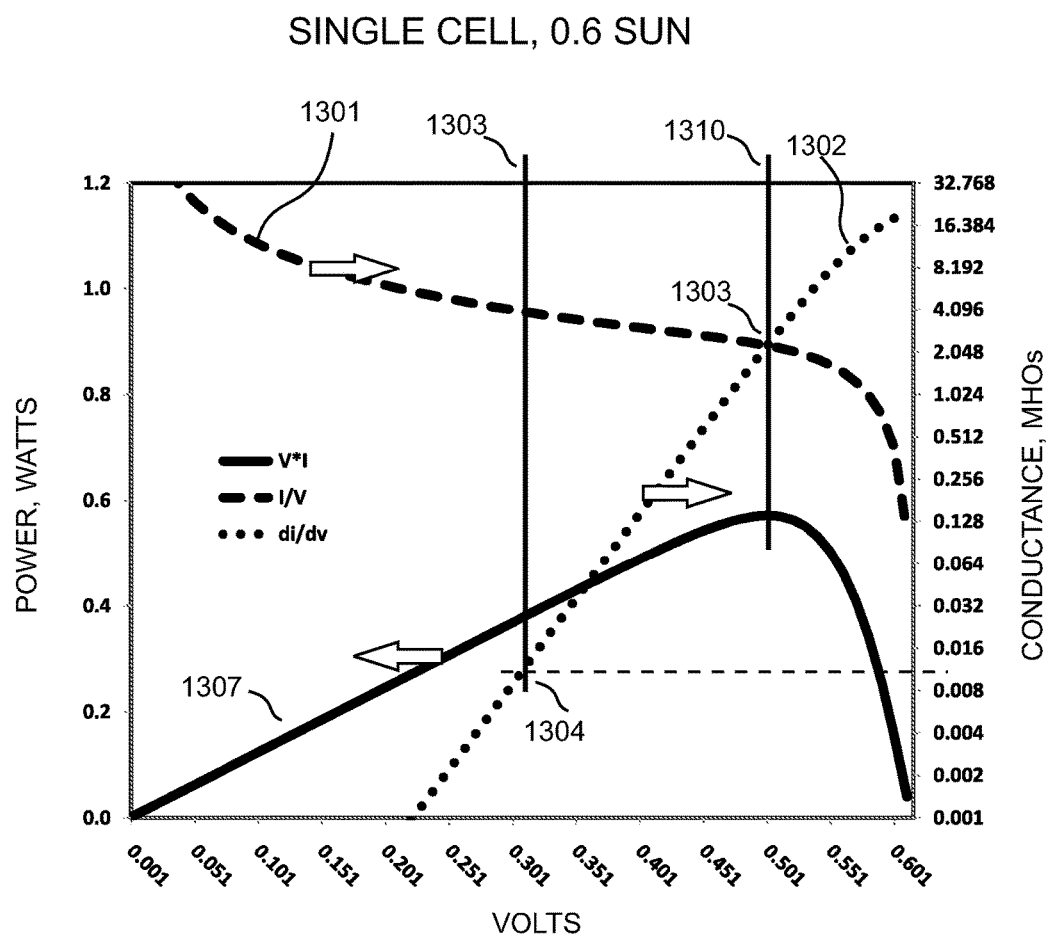
FIG. 13 is a graph of an exemplary response curve for a single one-quarter solar cell at 0.6 sun.

Similarly, FIG. 13 corresponds to the same single cell of FIG. 12, now only receiving 0.6 sun of insolation. Note that for the 0.6 sun case the I/V curve 1301 and the di/dv curve 1302 intersect 1303 at approximately a value of one half of the conductance value of the full sun (FIG. 12) point 1212. However, the maximum power point voltage for the 0.6 sun case is approximately the same as for the one sun case, along reference line 1310.

Figure 14:
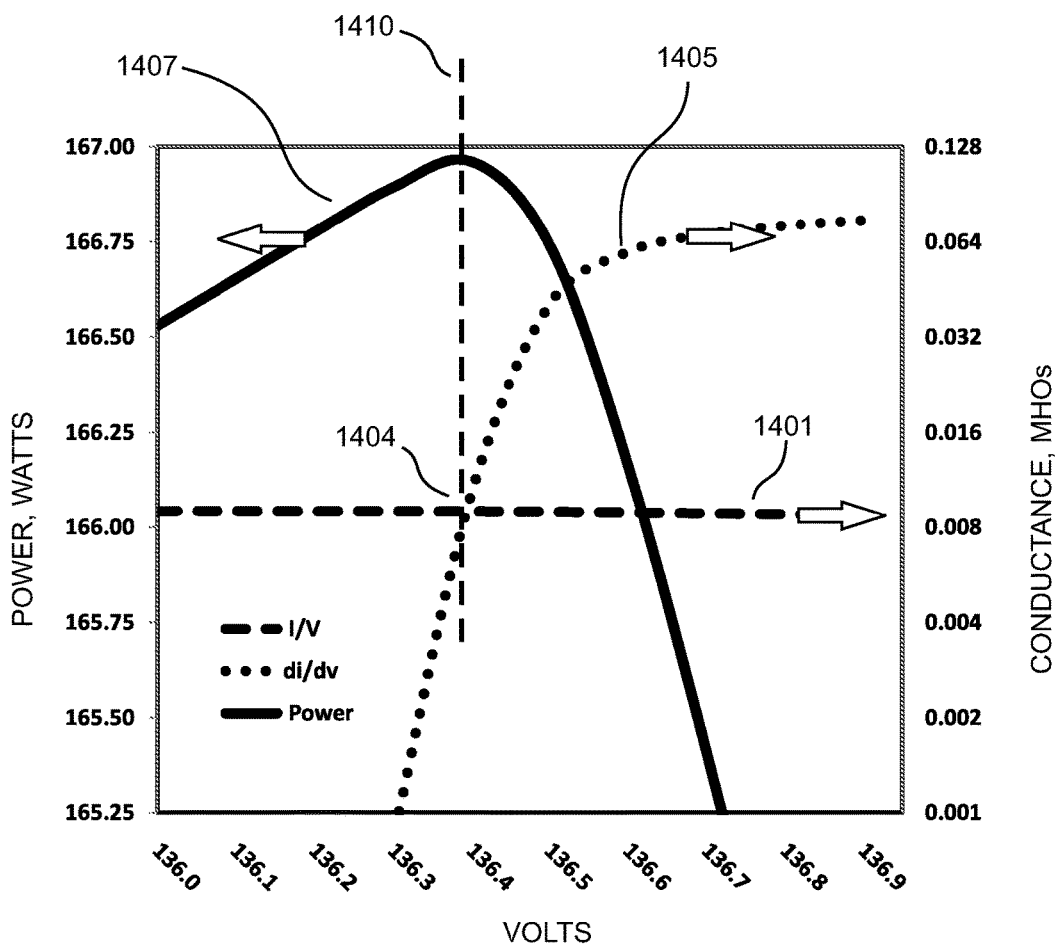
FIG. 14 is a graph of an exemplary response curve for 239 one-quarter solar cells at 1.0 sun and one one-quarter cell at 0.6 sun, configured as in FIG. 4.

Next, examine multiple cells in series, such as with a PV 400; that is, without bypass diodes. FIG. 14 relates the response for a PV 400 wherein 239 cells connected in series are experiencing one-sun insolation (as in FIG. 12) and one cell connected in series with the other 239 cells is experiencing only 0.6 sun insolation (as in FIG. 13). This condition may be the result of, for example, dirt or other shadows over only one cell. This case is an example of the potential power dissipation due to reverse voltage across a cell with limited insolation compared to the other cells in the PV 400. On the chart of FIG. 14 it may be seen that the intersection of the di/dv curve 1405 and the I/V curve 1401 correspond to approximately the maximum power point 1404 along the reference line 1410 of approximately 167 W. It can be seen in FIG. 14 that although the intersection may be close to the maximum power point it may not be precisely the maximum power point due to the different response characteristics of the single partially shaded cell and the 239 one sun cells. For example, at point 1404 the di/dv 1405 value is approximately 0.010 and the I/V 1401 value is approximately 0.009. Although this discrepancy accounts for an error of approximately 10% in the intersection of di/dv 1405 and I/V 1401 it may still be a practical predictor of the approximate location of the voltage for the maximum power point. Because the value of di/dv shows such high sensitivity in this region there may be no practical difference in power between the intersection of the two curves and where the maximum power point actually occurs more precisely. Note that FIG. 14 scales indicate a very small range; a range of two watts 1407 across a voltage range of less than one volt.

FIG. 14 may be derived from measurements of individual cells composited together to form a response of a PV with these characteristics. To understand the operating points imposed when one portion of a PV 400 is illuminated at one level with a different portion of the PV 400 at another level, re-examine FIG. 12 and FIG. 13 in light of FIG. 14. Looking at FIG. 12, we see the case for the individual cells that are operating at one sun. From FIG. 14 we see an operating point of about 136.4 volts. Anticipating a voltage drop of about 0.5 volts in the cell experiencing 0.6 sun, we have a drop from the remaining 239 fully-illuminated cells of 135.9 volts, or about 0.57 volts each since all 240 cells are in series, therefore their individual voltages are added together.

The vertical reference line 1203 represents the operating condition of the 239 cells shown in FIG. 14 (0.57 volts), a voltage above the maximum power point 1212 of a single cell at 1.0 sun. The fully illuminated cells may be operated at a voltage above their normal operating point in order for their current to be reduced to find a solution providing the same current as the one shaded cell, which is in series with them. Still looking to FIG. 12 (data for one cell), at point 1204 along the reference line 1203 corresponding to 0.57 volts, each individual cell has a value of di/dv 1202 of about 19 MHOs, therefore the series connection of 239 cells yields a value of 0.080 using the formula EQ1 for the total conductance of conductances electrically connected in series.

Now looking at FIG. 13, the single cell operating at 0.6 sun is at about the operating point (0.008 MHOs) and the conditions that are shown in FIG. 14 at the approximated maximum power point 1404. This cell is operating significantly below its maximum power point voltage (1303). The single cell is operating at a lower than the maximum power point voltage in order to operate at a slightly higher current in order to match with the fully illuminated cells. So in summary, the fully limited cells operate at a somewhat lower current and the partial illuminated cell operates at a somewhat higher current than their respective approximated maximum power point conditions in order to have a solution with the same current for 239 cells at one sun as shown in FIG. 12 and a weakly illuminated cell as shown in FIG. 13, all connected in series.

Closely examining the value of di/dv in FIG. 13 at point 1304, the value is about 0.012. The value of 0.012 for the partially shaded cell shown in FIG. 13 only having 0.6 suns of insolation is very close to the value of 0.10 for di/dv as shown in FIG. 14. This may be because the poorly illuminated cell is operating in a region of nearly constant current, which tends to minimize the change in current over the change in voltage. The 239 cells typified by FIG. 12, which are fully illuminated, are operating at a voltage above their approximated maximum power point where the current changes more rapidly as a function of voltage and therefore the value of a large change in current divided by a small change in voltage may be significantly larger in the 239 cells with a combined small signal conductance di/dv value of 0.080, or eight times larger than the value for the 239 strongly illuminated cells in series with the single cell only receiving 0.6 sun insolation. With a value for di/dv of 0.012 for the 0.6 sun cell and a value for di/dv of 0.080 for the fully illuminated 239 cells, we may calculate the value for the total di/dv of the combined 240 cells using the previously presented EQ1, or approximately 0.010. 0.010 may be approximately the value at the intersection of di/dv and I/V where the voltage for the approximated maximum power point was observed as shown on FIG. 14.

Examining FIG. 12, FIG. 13, and FIG. 14 shows that the operating condition wherein di/dv is about the same as I/V for the entire PV 400, the PV 400 may be close to its maximum power point, which is also a point which provides a positive voltage for the poorly illuminated cell and a positive voltage for the fully illuminated cells. Operating the entire PV 400 at the point at which di/dv equals I/V for the entire panel results in the poorly illuminated cell being protected from reverse conduction, thereby protected from potential damage. Indeed, in this case the power dissipated by the poorly illuminated cell may be actually slightly decreased over what it might have been otherwise if operated at its individual Vmin. For this reason protection diodes are not needed in constructing a photovoltaic panel according to the disclosure herein, thereby saving their cost and efficiency loss.

Figure 15:
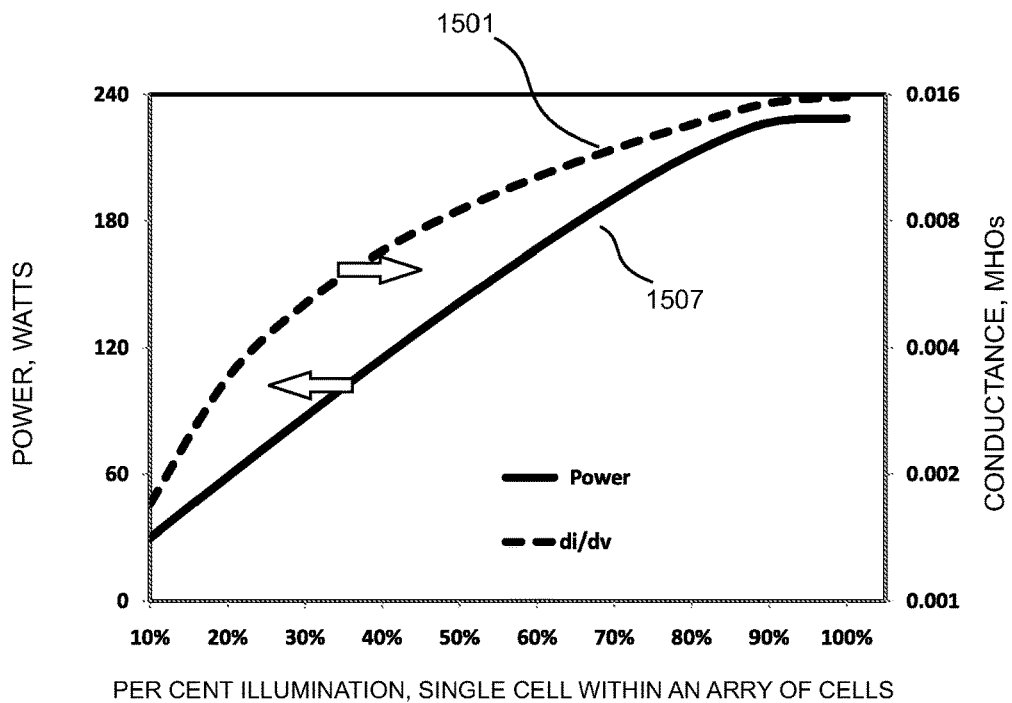
FIG. 15 is a graph of an exemplary response curve for 239 solar cells receiving 1.0 sun insolation and one cell being swept from 10 percent to 100 percent insolation.

Referring to FIG. 15, a power curve 1507 and a small signal conductance curve 1501 for an entire 240 cell PV 400 are shown for a range of insolation values for a single cell connected in electrical series with 239 fully illuminated cells. That is, the X-axis represents the percent illumination of the partially-shaded cell compared to the other 239 cells of a 240 cell PV 400. As the illumination level of the partially-shaded cell decreases from 100% to 10% the power of the PV 400 falls according to the curve 1507. Note that for the first approximately 10% of illumination reduction (that is, at the 90% insolation point) to the single partially-shaded cell, there is little power degradation in the output of the PV 400. Further reductions in insolation result in a relatively linear reduction in power. The aggregate di/dv curve 1501 decreases with insolation but by a complex relationship.

Figure 16:
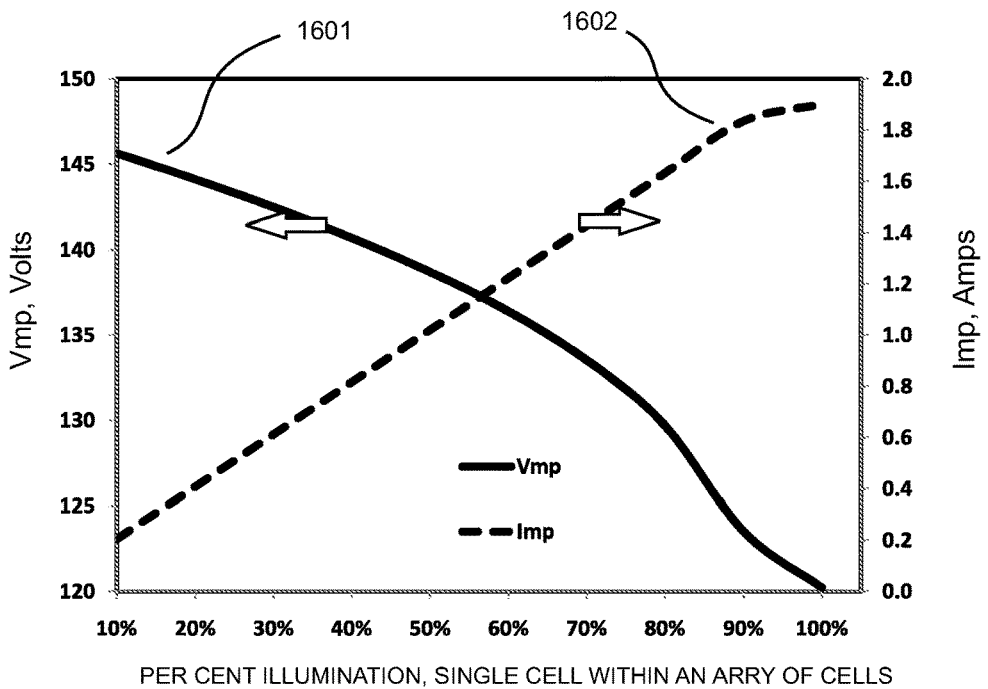
FIG. 16 is a graph of an exemplary IV curve for 239 solar cells at 1.0 cell and one cell of FIG. 4 from 10 percent to 100 percent insolation.

Examining FIG. 16, as in FIG. 15 the insolation of a single cell in the string of 240 total cells is shown, ranging from 100% to 10% of the insolation level of the other 239 cells. Examining the chart shown on FIG. 16 together with the chart shown on FIG. 15 one can see that as shading is increased (insolation decreased) of the single cell with 239 fully illuminated cells electrically connected in series, the voltage Vmp 1601 for the maximum power across the entire string of 240 cells increases. Looking at the section of light attenuation to the single cell in the region between 90% and 100% the voltage Vmp 1601 for the approximated maximum power is increasing and the current for the approximated maximum power is decreasing proportionally. The product of the voltage Vmin 1601 and current Imp 1602 are shown in the same region on FIG. 15, between 90% and 100%, as being nearly flat. For insolation levels below 90% incident upon the single cell there is a continuing increase in Vmp 1601 and a nearly linear decrease in current Imp 1602, resulting in the power loss that is shown from the 90% point on down on FIG. 15.

Hereinbefore, the present disclosure has focused on applications wherein terminals O+ 512 and O− 513 are the output terminals of a PV embodying the disclosed novel concepts. In other embodiments, terminals O+ 512 and O− 513 may represent an intermediate point. For example, in embodiments wherein the present invention is integrated within an AC inverter, terminals O+ 512 and O− 513 might be the terminals connected to an input DC link capacitor. In another embodiment integrated within an AC inverter, methods 800 or 900 may be encoded into the inverter control method, thereby augmenting or replacing the MPPT or safety algorithms. The disclosed inventive concepts may be embodied within a PAMCC modulator, wherein terminals O+ 512 and O− 513 may be terminals connected as the output of a differential boost section, replacing that section. In another embodiment within a PAMCC modulator, methods 800 or 900 may be encoded into a modulator controller, augmenting or replacing the MPPT and safety algorithms.

Figure 17:
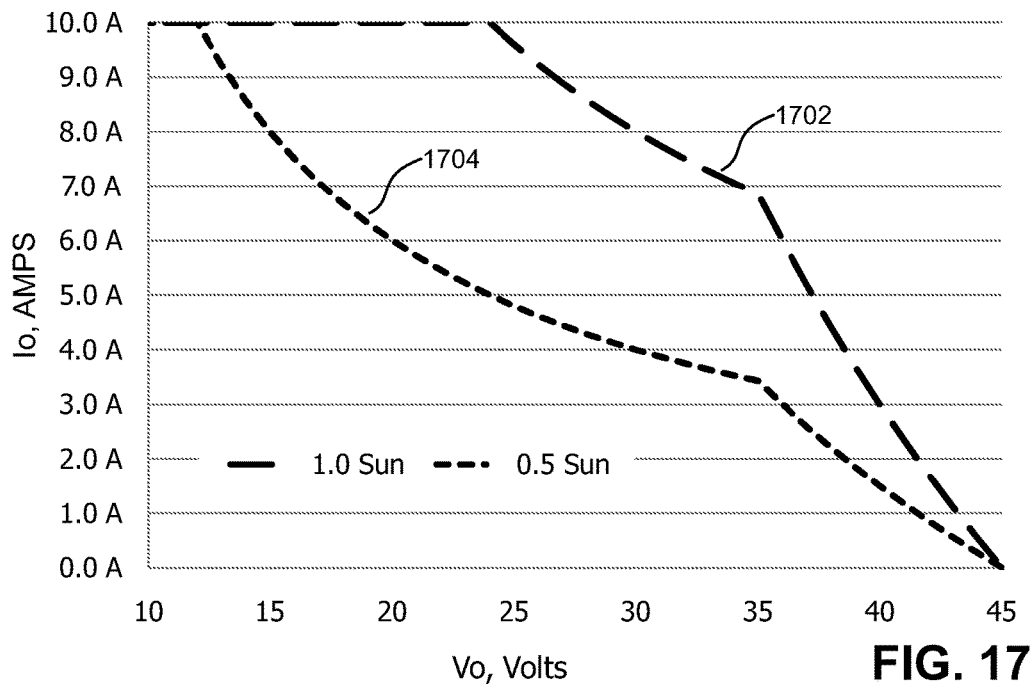
FIG. 17 is a graph of the relationship between output voltage and current for a solar panel constructed and controlled according to the disclosed concept.
Figure 18:
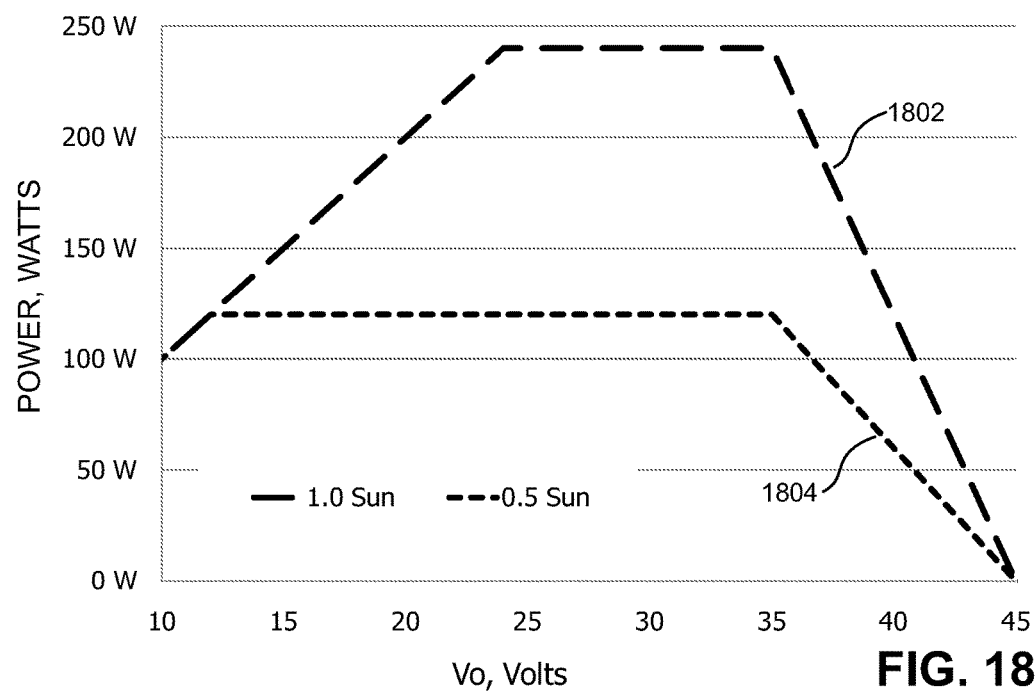
FIG. 18 is a graph of the relationship between output voltage and power for a solar panel constructed and controlled according to the disclosed concept.

FIG. 17 shows the relationship between Vo 629 and Io for a PV 400 controlled by a system 500 according to the disclosed methods 800, 900, 1900. The figure shows an IV curve at one sun 1702 and at 0.5 sun 1704. FIG. 17 may be used to calculate power values at each voltage Vo 1702, to determine FIG. 18. FIG. 17 and FIG. 18 are what an external inverter would "see" for the response characteristics of a PV 400 being controlled by the system 500 in accordance with the processes 800, 900, 1900. The result is that there is a very wide range of Vo voltages (in the example, from approximately 23 volts to 35 volts) wherein the maximum power output (1802, 1804) may be maintained, regardless of instant insolation level.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

RESOLUTION OF CONFLICTS

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

What is claimed is:

1. A solar panel, comprising a number of banks of solar cells, wherein at least one bank comprises a number "n" of solar cells electrically connected in series, wherein "n" is greater than ($V_{BD}/V_{oc}$), where:

$V_{oc}$=the forward bias voltage specification of each solar cell, and $V_{BD}$=the reverse bias breakdown voltage specification of each solar cell; and an electronic controller electrically connected to electrical output terminals of each bank of solar cells, wherein the controller controls an output condition of the terminals such that no cells are reverse biased.

2. The solar panel of claim 1, wherein the number of banks is two.

3. The solar panel of claim 1, wherein the number of banks is more than two.

4. The solar panel of claim 1, wherein at least two banks have a different number of solar cells.

5. The solar panel of claim 1, wherein an electrical bypass device is not connected to any cell within the solar panel.

6. The solar panel of claim 1, wherein the solar panel is of rectangular shape, and further wherein the long axes of the solar cells are parallel to the long axis of the solar panel.

7. The solar panel of claim 1, wherein the number of banks is two, including a first bank comprising eighty percent of the total number of solar cells, and a second bank comprising twenty percent of the total number of solar cells.

8. The solar panel of claim 1, wherein the output condition of the terminals is voltage.

* * * * *